(12) United States Patent
Yang

(10) Patent No.: US 11,901,311 B2
(45) Date of Patent: Feb. 13, 2024

(54) MEMORY DEVICE AND MANUFACTURING METHOD THEREOF

(71) Applicant: MACRONIX International Co., Ltd., Hsinchu (TW)

(72) Inventor: Chin-Cheng Yang, Kaohsiung (TW)

(73) Assignee: MACRONIX International Co., Ltd., Hsinchu (TW)

( * ) Notice: Subject to any disclaimer, the term of this patent is extended or adjusted under 35 U.S.C. 154(b) by 327 days.

(21) Appl. No.: 17/390,727

(22) Filed: Jul. 30, 2021

(65) Prior Publication Data
US 2023/0033311 A1    Feb. 2, 2023

(51) Int. Cl.
| | |
|---|---|
| *H01L 23/00* | (2006.01) |
| *H01L 23/522* | (2006.01) |
| *H01L 23/528* | (2006.01) |
| *H01L 21/768* | (2006.01) |
| *H10B 41/27* | (2023.01) |
| *H10B 43/27* | (2023.01) |

(52) U.S. Cl.
CPC ...... *H01L 23/562* (2013.01); *H01L 21/76816* (2013.01); *H01L 21/76877* (2013.01); *H01L 23/5226* (2013.01); *H01L 23/5283* (2013.01); *H10B 41/27* (2023.02); *H10B 43/27* (2023.02)

(58) Field of Classification Search
None
See application file for complete search history.

(56) References Cited

U.S. PATENT DOCUMENTS

2020/0381450 A1    12/2020  Lue et al.
2021/0296324 A1*    9/2021  Lim .................... H10B 43/40

OTHER PUBLICATIONS

Hang-Ting Lue, et al., "Memory Device and Method of Manufacturing the Same," Unpublished U.S. Appl. No. 17/185,275, filed Feb. 25, 2021.
Teng-Hao Yeh, et al., "Three-Dimensional Memory Device and Method for Manufacturing the Same," Unpublished U.S. Appl. No. 17/125,407, filed Dec. 17, 2020.

* cited by examiner

*Primary Examiner* — Hsien Ming Lee
(74) *Attorney, Agent, or Firm* — J.C. PATENTS

(57) ABSTRACT

A method of fabricating a memory device includes patterning a stacked structure to form a first staircase structure and a second staircase structure; patterning a conductive layer under the stacked structure to form a first slit trench along a first direction; forming a first dielectric layer overlaying the first staircase structure and the second staircase structure and filling into the first slit trench, wherein the first dielectric layer filled in the first slit trench forms a first slit; patterning the first dielectric layer, the stacked structure, and the conductive layer to form multiple second slit trenches, wherein the second slit trenches along a second direction perpendicular to the first direction; performing a replacement process to replace the sacrificial layers with multiple gate conductive layers; and filling a second dielectric layer in the second slit trenches to form multiple second slits.

20 Claims, 21 Drawing Sheets

MEMORY DEVICE AND MANUFACTURING METHOD THEREOF

BACKGROUND

Technical Field

The embodiment of the disclosure relates to a semiconductor device and a manufacturing method thereof, and particularly, to a flash memory device and a manufacturing method thereof.

Description of Related Art

Since a non-volatile memory device has the advantage that stored data does not disappear at power-off, it becomes a widely used memory device for a personal computer or other electronics equipment. Currently, the three-dimensional memory commonly used in the industry includes a NOR memory and a NAND memory. In addition, another type of three-dimensional memory (3D) is a 3D AND memory, which can be applied to a multi-dimensional memory array with high integration and high area utilization, and has an advantage of a fast operation speed. Therefore, the development of a three-dimensional memory has gradually become the current trend.

SUMMARY

According to an embodiment of the disclosure, a method of fabricating a memory device includes providing a substrate, wherein the substrate comprises a first tile region and a second tile region; forming a conductive layer over the substrate; forming a stacked structure on the conductive layer, wherein stacked structure comprises multiple insulating layers and multiple sacrificial layers which alternate with each other; patterning the stacked structure to form a first staircase structure in the first tile region and a second staircase structure in the second tile region; patterning the conductive layer to form a first slit trench along a first direction in the conductive layer and between the first tile region and the second tile region; forming a first dielectric layer overlaying the first staircase structure and the second staircase structure and filling into the first slit trench, wherein the first dielectric layer filled in the first slit trench forms a first slit along the first direction; patterning the first dielectric layer, the stacked structure, and the conductive layer to form multiple second slit trenches in the first tile region and the second tile region respectively, wherein the second slit trenches along a second direction perpendicular to the first direction; performing a replacement process to replace the sacrificial layers with multiple gate conductive layers; and filling a second dielectric layer in the second slit trenches to form multiple second slits.

According to an embodiment of the disclosure, a memory device includes a substrate including a first region and a second region; a conductive layer over the substrate in the first region and the second region, wherein the conductive layer has a first slit trench along a first direction in a region between the first region and the second region; a stacked structure on the conductive layer, wherein the stacked structure comprises a first staircase structure in the first region and a second staircase structure in the second region; a dielectric layer overlaying the first staircase structure and the second staircase structure, and filling into the first slit trench, wherein the dielectric layer filled in the first slit trench forms a first slit along the first direction; and multiple second slits along a second direction perpendicular to the first direction extending from a top surface of the dielectric layer through the stacked structure to a bottom surface of the conductive layer in the first region and the second region.

Based on the above, in the embodiments of the disclosure, the first slit between the adjacent tiles are formed before the second silt trench for the second slit between the adjacent blocks is formed, and thus the first slit may be used as a support structure during the replacement process for the gate layers to avoid bending or even collapse of the gate stack structures.

DESCRIPTION OF THE EMBODIMENTS

Figure 1:
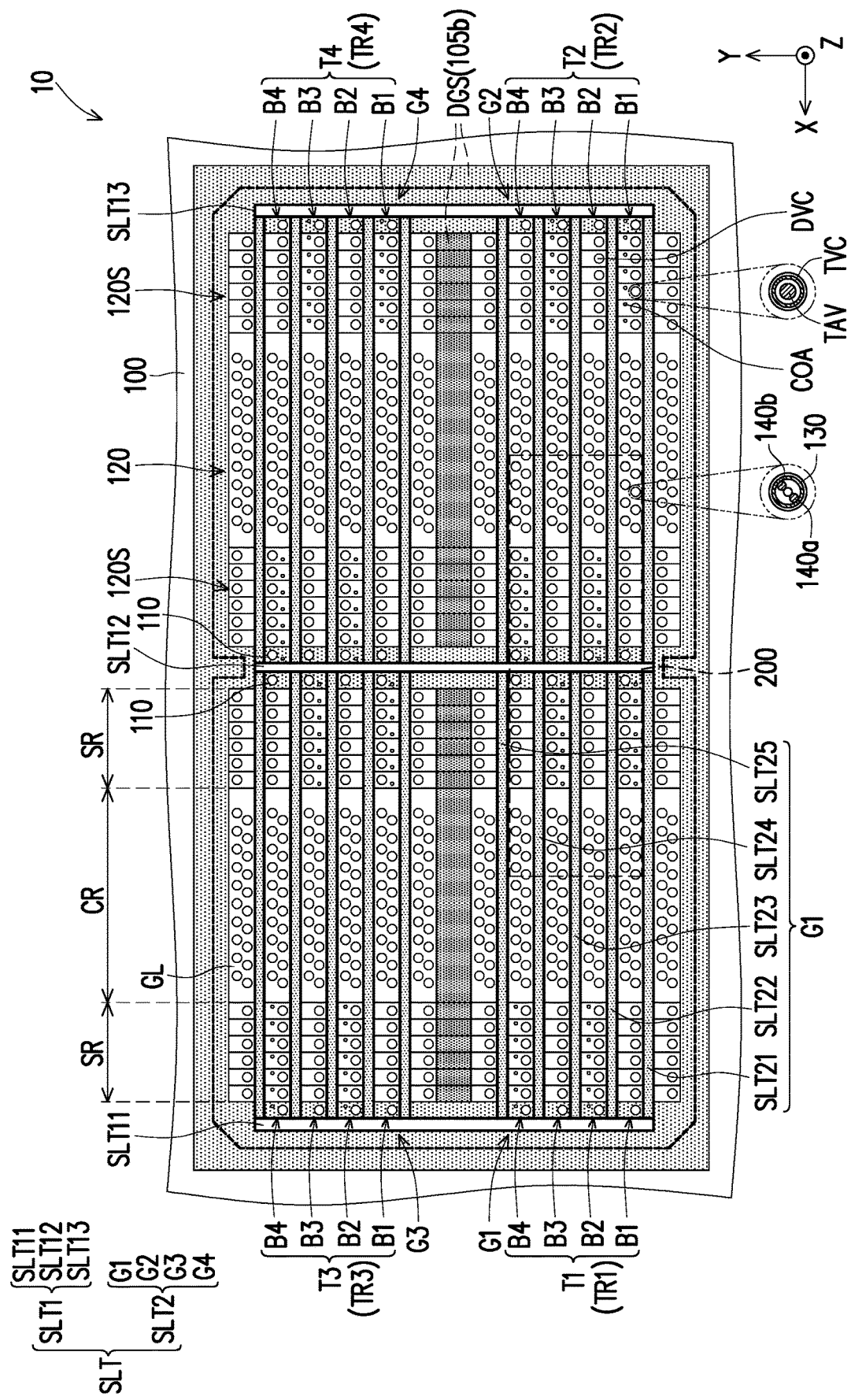
FIG. 1 is a top view of a three-dimensional memory device according to an embodiment of the disclosure.

FIG. 1 is a top view of a three-dimensional memory device according to an embodiment of the disclosure. Referring to FIG. 1, a three-dimensional memory device 10 may include multiple tiles T1 to T4, and each of the tiles T1 to T4 may include multiple blocks B1 to B4. FIG. 1 shows four tiles T1 to T4 and four blocks B1 to B4 according to an exemplary embodiment. However, the number of the tiles and the number of the blocks included in each tile of the three-dimensional memory device 10 are not limited thereto.

Each of the blocks B1 to B4 may include a conductive layer 110, a gate stack structure 120, multiple channel pillars 130, multiple source and drain pillars 140a and 140b, and multiple charge storage structures 150 (shown in FIG. 3I) disposed on a substrate 100. The conductive layer 110 is disposed between the substrate 100 and the gate stack structure 120, and may be grounded. The conductive layer 110 may be referred to as a ground conductive layer. The conductive layer 110 is patterned by cutting conductive layer 110" (shown in FIG. 3A) multiple times. In the first time, the conductive layer 110" is cut to form a conductive layer 110' with a slit trench 110T' along the Y direction, and then the conductive layer 110' is cut to form a slit trench 144T along the X direction after a slit SLT1 is filled in the slit trench 110T', wherein the Y direction is perpendicular to the X direction (shown in FIG. 3A to FIG. 3J, and FIG. 4A to FIG. 4B).

Referring to FIG. 1, a slit SLT is formed to separate the tiles T1 to T4 and the blocks B1 to B4. The slit SLT may include multiple slits SLT1 and SLT2 extending along different directions. In some embodiments, the slit SLT1 is formed in the slit trench 110T', and is a strip extending along the Y direction, and the slit SLT2 is formed in the slit trench 144T, and is a strip extending along the X direction.

The slit SLT1 may be referred to as first slit SLT1, and may include slits SLT11, SLT12, and SLT13, which are separated from each other by a non-zero distance and arranged in parallel.

The slits SLT11, SLT12, and SLT13 are disposed at ends of conductive layers 110 which is disposed below staircase structures 120S of the gate stack structures 120.

The split SLT2 may be referred to as second slit SLT2, and may include multiple groups G1, G2, G3, and G4 arranged in the tiles T1, T2, T3, and T4, respectively. Each group (G1, G2, G3, or G4) includes splits SLT21, SLT22, SLT23, SLT24 and SLT25, which are separated from each other by a non-zero distance and arranged in parallel. Each slit (e.g., SLT22) separates gate stack structures 120 and the conductive layers 110 below the gate stack structures 120 of two adjacent blocks (e.g., B1 and B2) in the Y direction. The slits SLT1 and SLT2 may have materials formed by different method.

In the embodiment of the present invention, the slits SLT1 and SLT2 are formed at different times. The slit SLT1 is formed before the formation of the slit SLT2 and the formation of gate layers GL of the gate stack structures 120, and thus may be used as a support structure during the replacement process for the gate layers GL to avoid bending or even collapse of the gate stack structures 120.

Figure 2A:
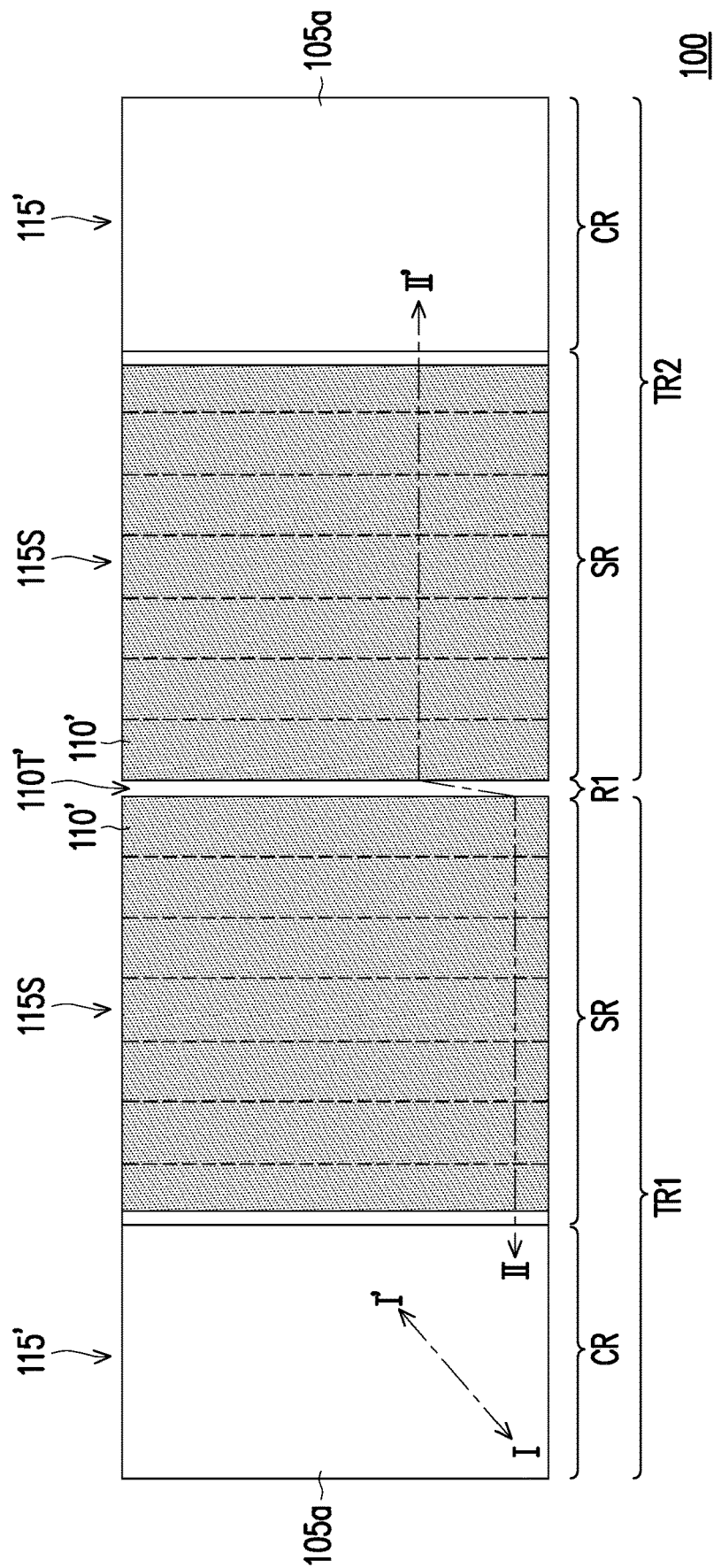
FIG. 2A to FIG. 2D are top views showing a manufacturing process of a three-dimensional memory device according to an embodiment of the disclosure.
Figure 2B:
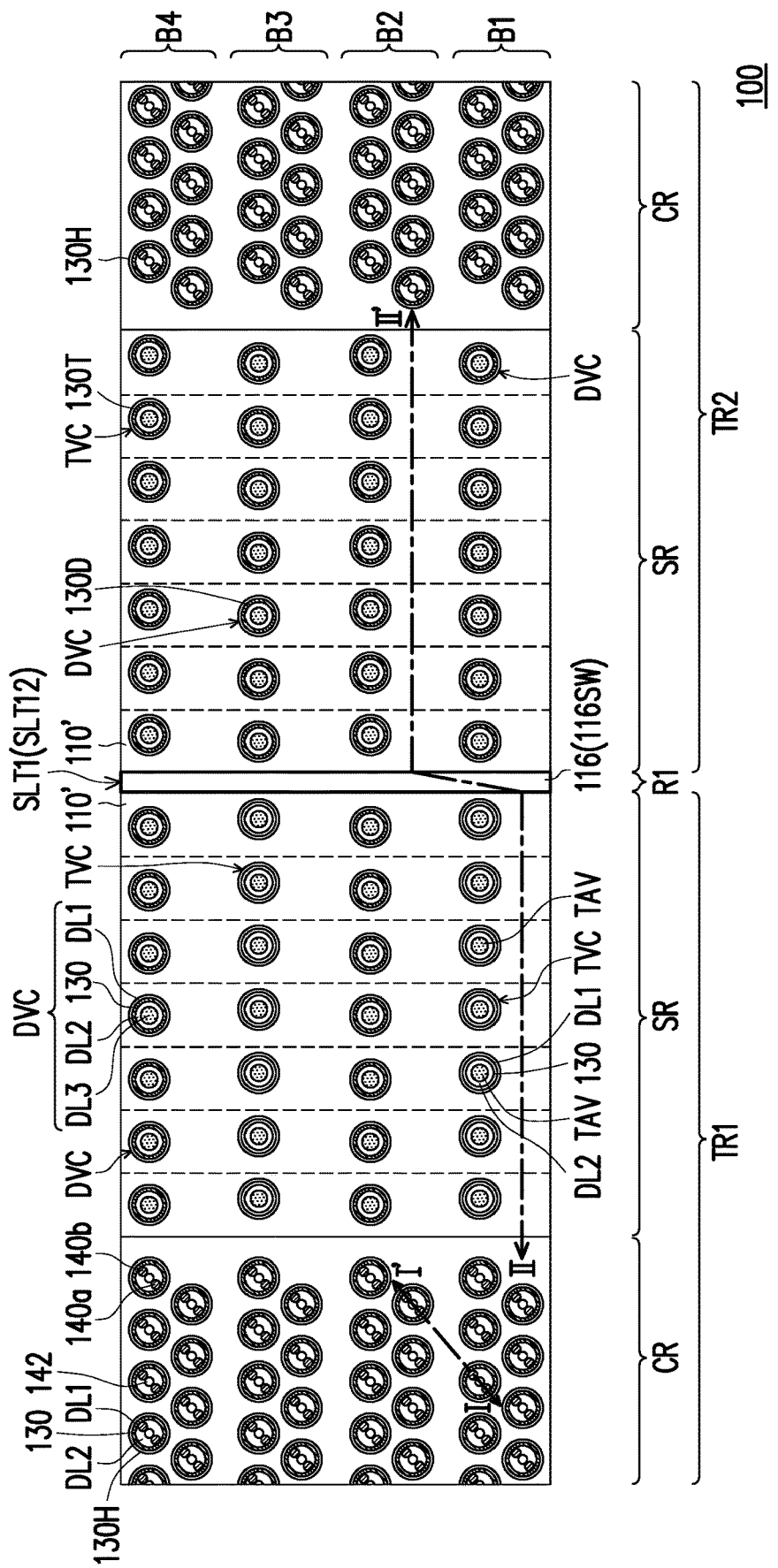
Figure 2C:
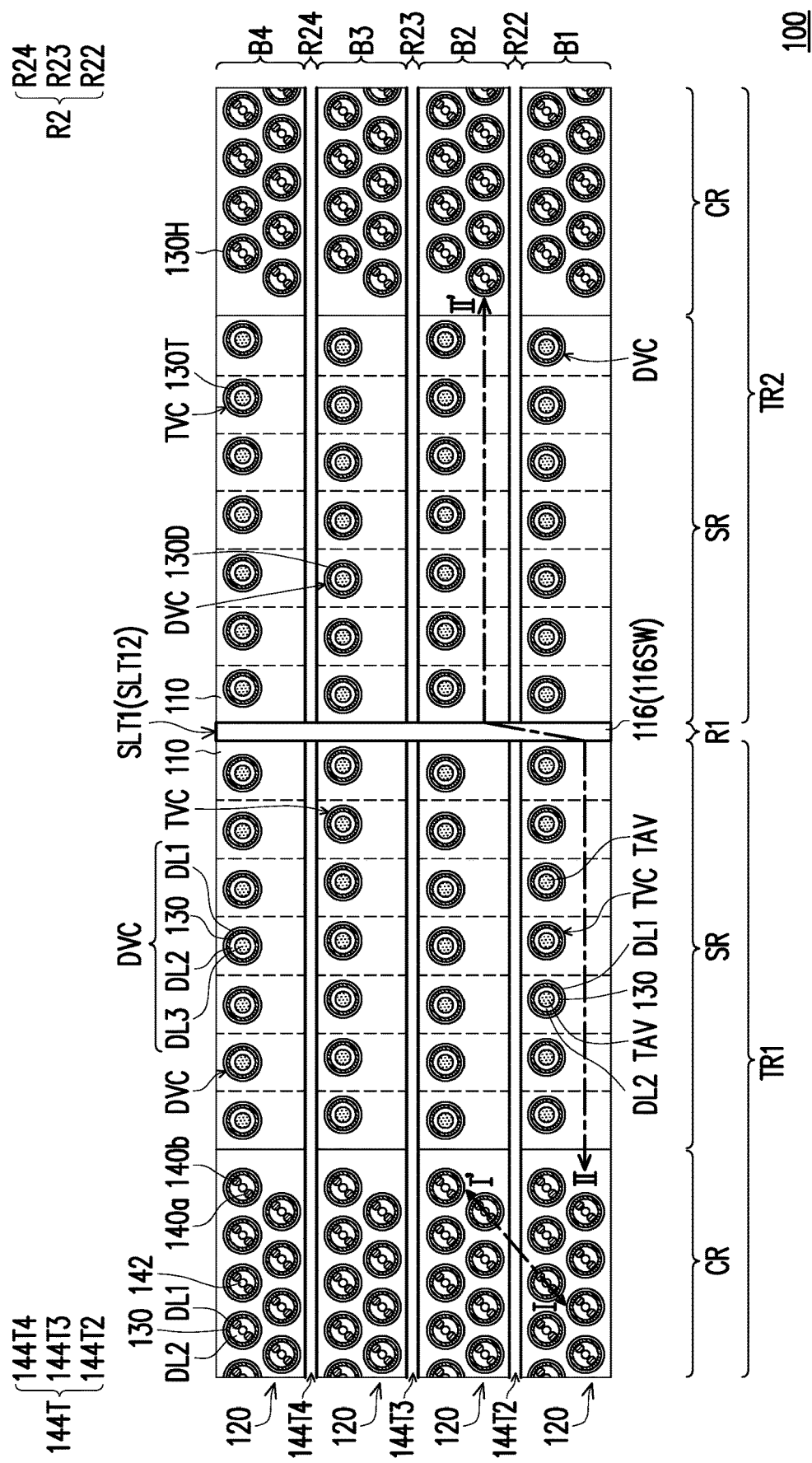
Figure 2D:
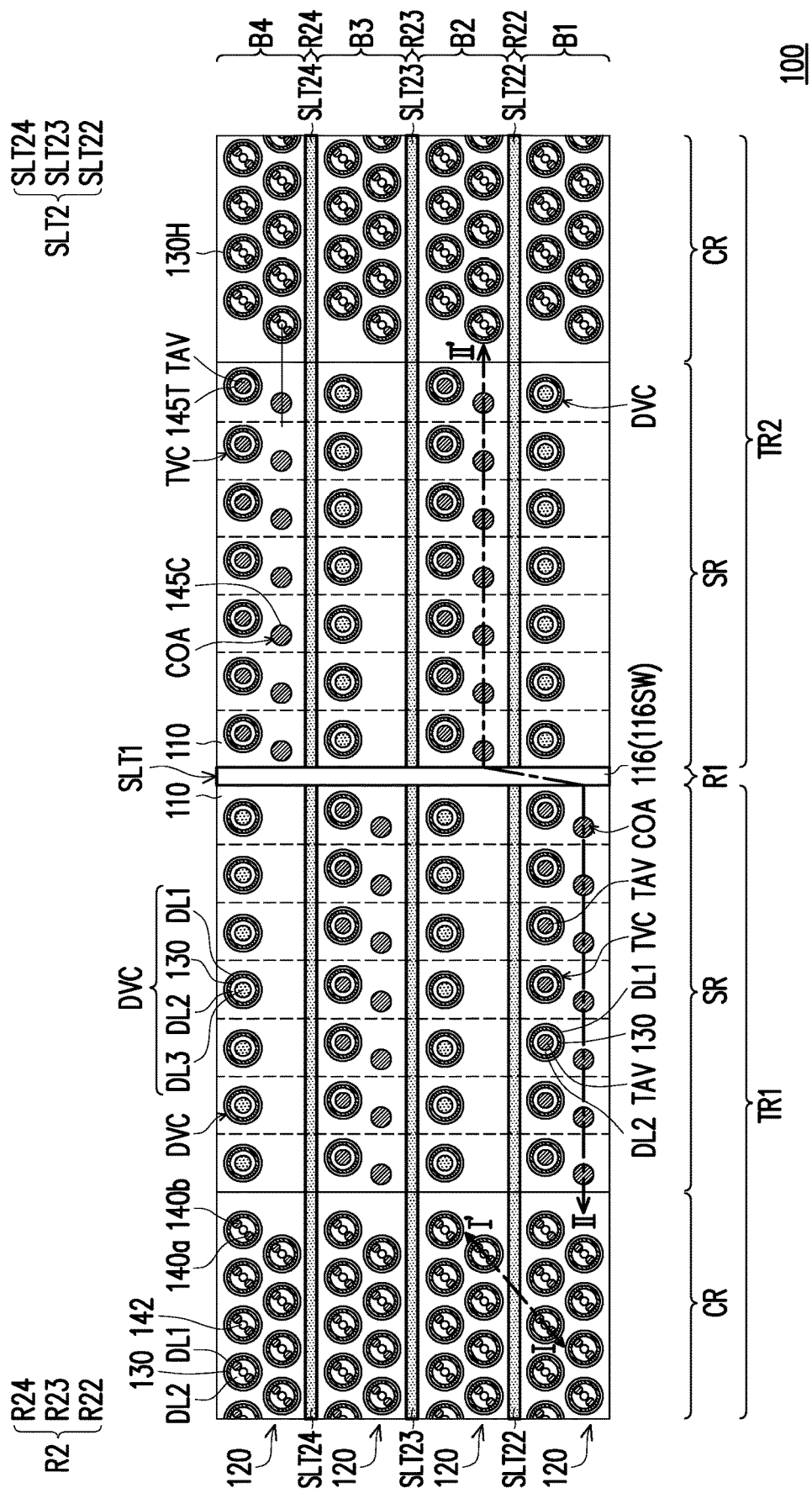

FIG. 2A to FIG. 2D are top views showing a manufacturing process of a 3D memory device according to an embodiment of the disclosure. FIG. 2D is an enlarged view of the 3D memory device in area 200 shown in FIG. 1. FIG. 3A to FIG. 3J are schematic partial cross-sectional views showing a manufacturing process of the 3D memory device taken along lines I-I' and II-II' of FIG. 2A to FIG. 2D. FIG. 4A is a top view of the three-dimensional memory device of FIG. 3B. FIG. 4B is a top view of the three-dimensional memory device of FIG. 3G to FIG. 3H. For convenience of illustration, some components are not shown in FIG. 4A and FIG. 4B.

Figure 3A:
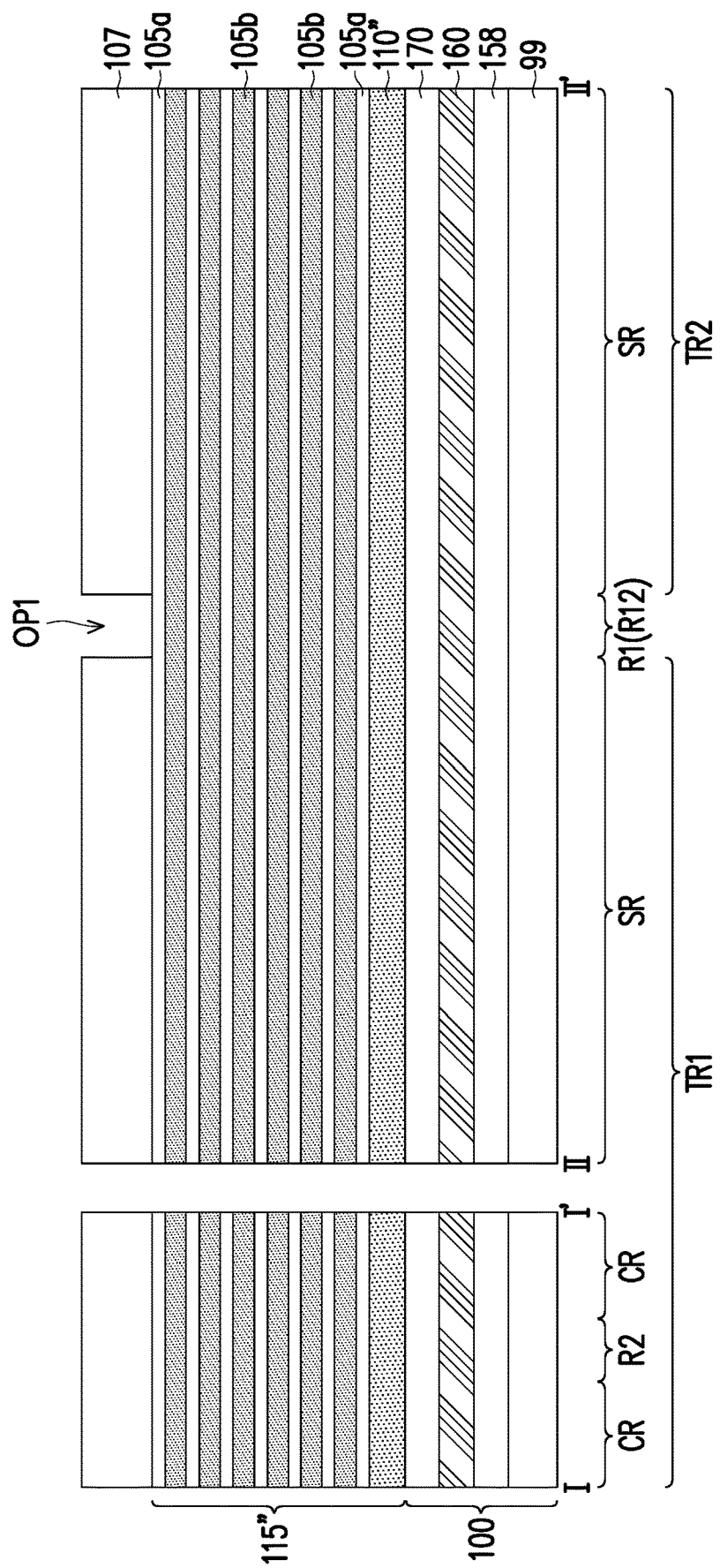
FIG. 3A to FIG. 3J are schematic partial cross-sectional views showing a manufacturing process of the three-dimensional memory device taken along lines I-I' and II-II' of FIG. 2A to FIG. 2D.
Figure 4A:
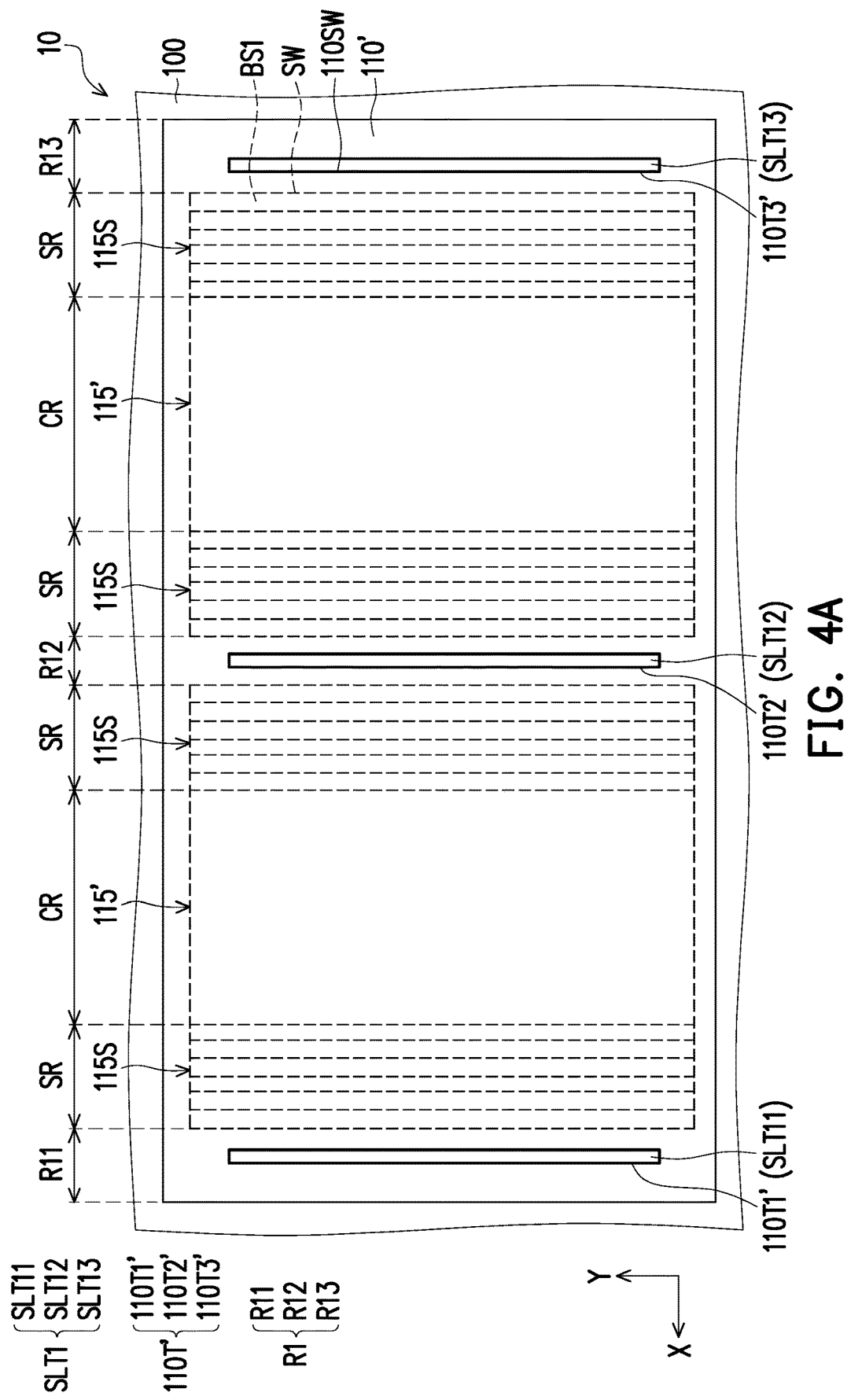
FIG. 4A is a top view of the three-dimensional memory device of FIG. 3B.
Figure 4B:
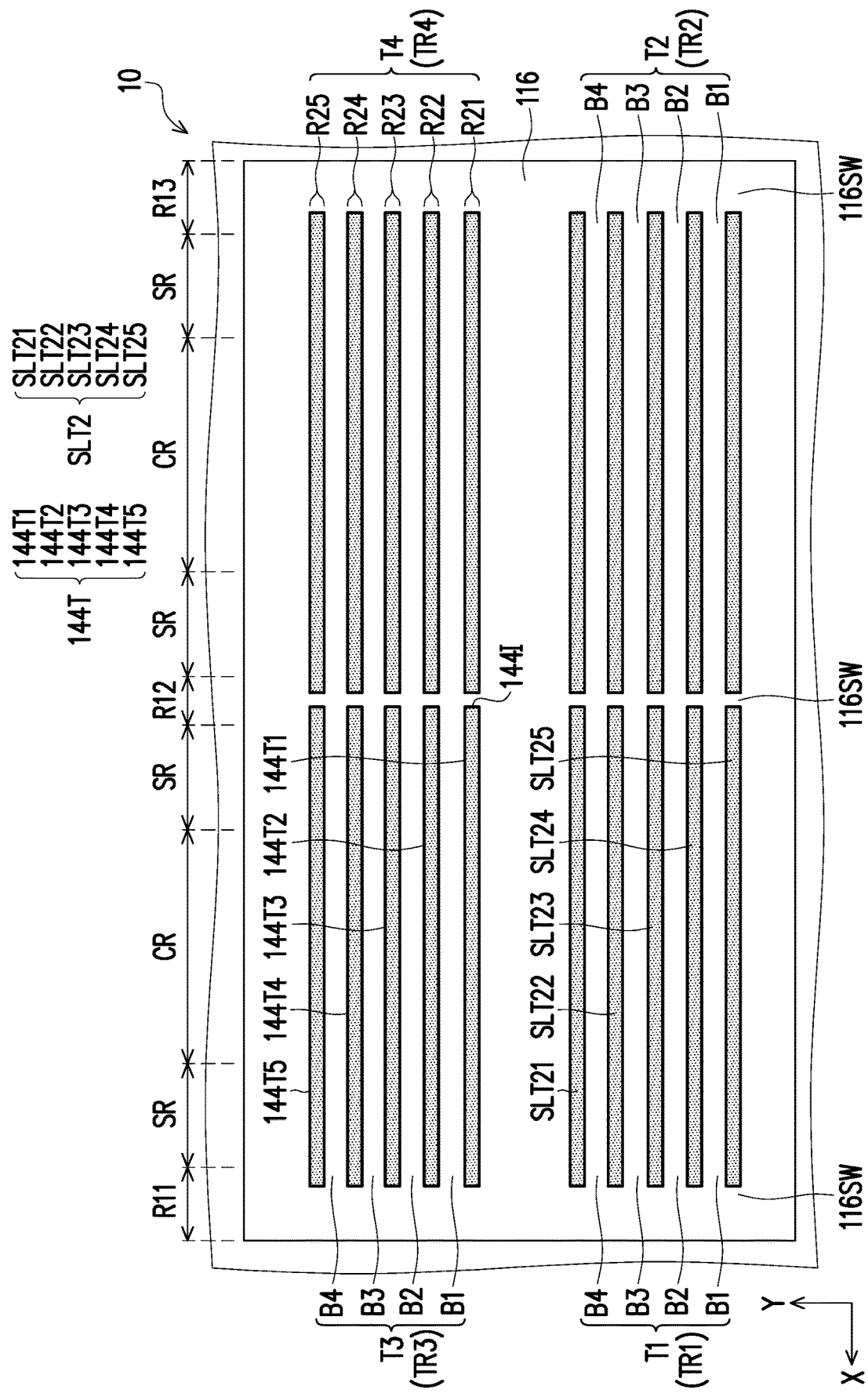
FIG. 4B is a top view of the three-dimensional memory device of FIG. 3G to FIG. 3H.

First, referring to FIG. 3A, a substrate 100 is provided. The substrate 100 may include multiple tile regions TR1 to TR4, as shown in FIG. 1. Each of the tile regions T1 to T4 may include a cell region CR and staircase regions SR located on two opposite sides of the cell region CR. The substrate 100 may include a semiconductor substrate 99, and components formed on the semiconductor substrate 99 such as an active device (e.g., a PMOS, an NMOS, a CMOS, a JFET, a BJT, or a diode), an inner dielectric layer 158, a contact (not shown), a conductive line 160, an interlayer dielectric layer 170, and a via (e.g., an interconnect structure). However, for convenience of illustration, only the inner dielectric layer 158, the conductive line 160, and the interlayer dielectric layer 170 are shown.

Next, a conductive material layer 110" is formed on the substrate 100. The conductive material layer 110" may include doped polysilicon. For example, the material of the conductive layer 110" may include P-type doped polysilicon formed by chemical vapor deposition (CVD). Afterwards, a stack structure 115" is formed on the conductive material layer 110". In some embodiments, the stack structure 115" may include multiple insulating material layers 105a and multiple sacrificial material layers 105b alternately stacked with each other on the conductive material layer 110". In some embodiments, the insulating material layer 105a may be a silicon oxide layer, and the sacrificial material layer 105b may be a silicon nitride layer.

Figure 3B:
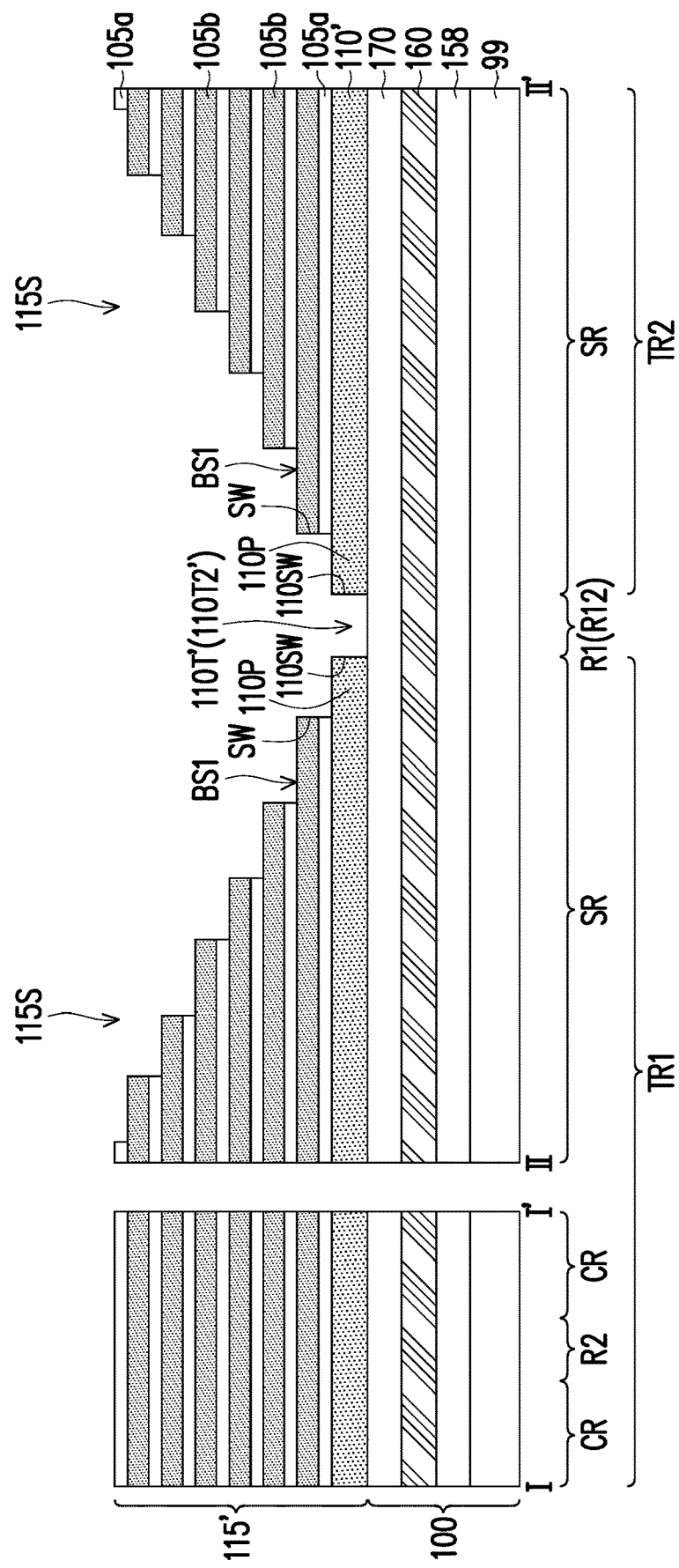

Referring to FIG. 2A and FIG. 3B, the stack structure 115" and the conductive material layer 110" are patterned through lithography processes, etching processes and trim processes to form a conducive layer 110', and stack structures 115' with staircase structures 115S. The stack structures 115' includes staircase structures 115S formed in the staircase regions SR of each tiles T1-T4. The conducive layer 110' has a slit trench 110T' therein. The slit trench 110T' includes slit trenches 110T1', 110T2', and 110T3' corresponding to the slits SLT11, SLT12, and SLT13 (shown in FIG. 1), each slit trenches 110T1 ', 110T2', and 110T3' is a strip or a rectangular extending along the Y direction, which are separated from each other as shown in FIG. 4A. The slit trench 110T1' (e.g., 110T1', 110T2', and 110T3') is formed in a slit region R1 (e.g., R11, R12, and R13) at the boundary of the staircase regions SR.

In some embodiments, the method of formation of the conducive layer 110', the staircase structures 115S and the slit trench 110T' may be as follows, but the present invention does not limited thereto. First, a patterned photoresist layer 107 is formed on the stack structures 115" shown in FIG. 3A. The patterned photoresist layer 107 has openings OP1 exposing the stack structure 115" in the slit region R1. The openings OP1 are corresponding to the slit trenches 110T1', 110T2' and 110T3' to be formed. The stack structure 115" is etched by using the patterned photoresist layer 107 as an etch mask layer, so as to transform the pattern of the patterned photoresist layer 107 to the stack structure 115". Thereafter, the patterned photoresist layer 107 is trimmed, an etching process is performed, and the trimmed photoresist layer (not shown) is removed. The formation of the patterned photoresist layer, the trimming process, the etching process and the removal of the trimmed photoresist layer may be referred to as a cycle. Multiple cycles are performed until the staircase structures 115S and the slit trench 110T are formed.

In some embodiments, the slit trench 110T' is formed so that sidewalls 110SW of a protrude portion 110P of the conductive layer 110' exposed by the slit trench 110T' protrude from sidewalls SW of bottommost stairs BS1 of the staircase structures 115S as shown in FIGS. 3B and 4A.

Figure 5A:
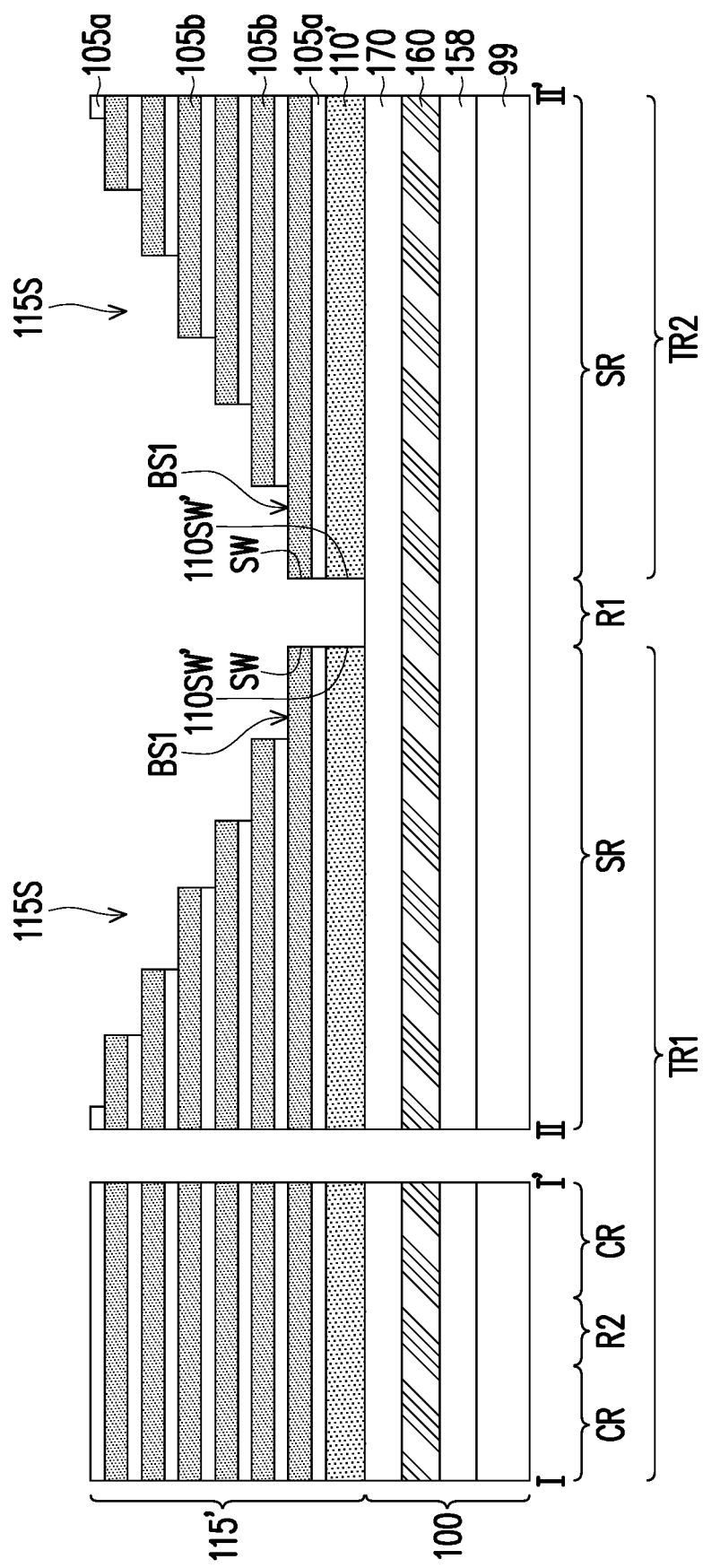
FIG. 5A and FIG. 5B are schematic partial cross-sectional views showing a manufacturing process of a three-dimensional memory device according to another embodiment of the disclosure.
Figure 6A:
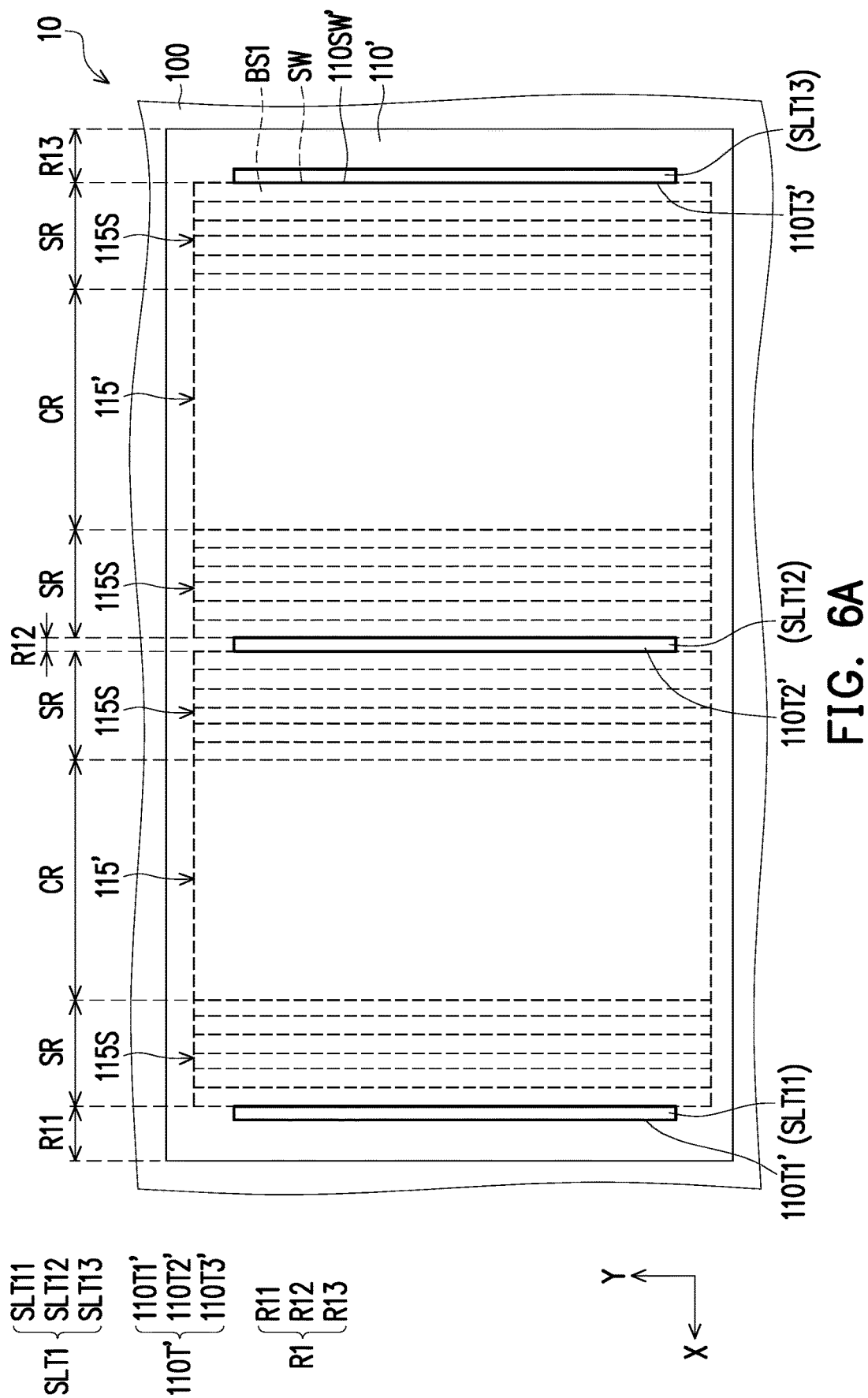
FIG. 6A is a top view of the three-dimensional memory device of FIG. 5A.

In alternative embodiments, after the bottommost stair BS1 is formed, the conductive layer 110" is etched by using bottommost stairs BS1 of the staircase structures 115S as an etch mask layer, so that slit trenches 110T' (e.g., 110T1', 110T2' and 110T3') is formed in the conductive layer 110'. Sidewalls 110SW' of the conductive layer 110' exposed by the slit trench 110T' (e.g., 110T1', 110T2' and 110T3') are aligned with sidewalls SW of the bottommost stairs BS1 as show in FIG. 5A and FIG. 6A.

Figure 3C:
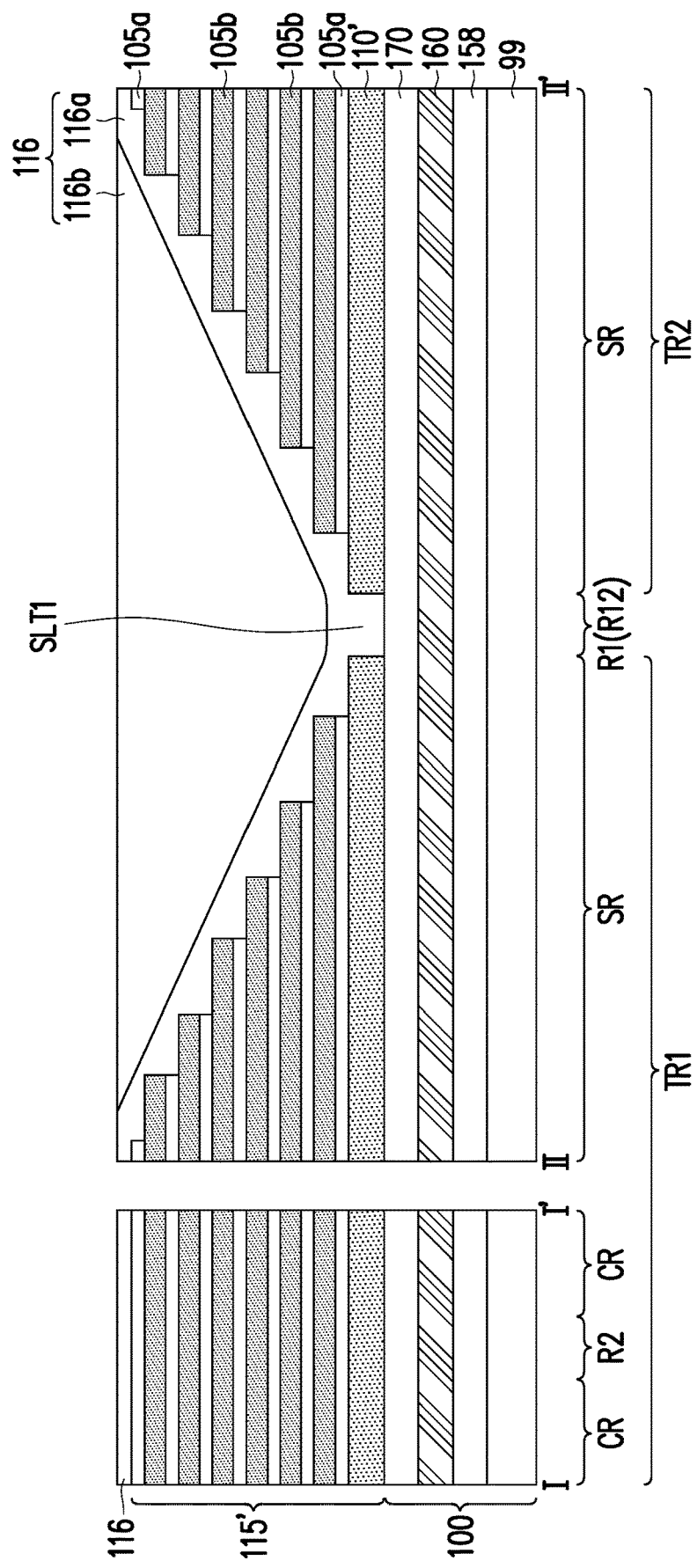

Referring to FIG. 2B and FIG. 3C, a dielectric layer 116 is formed on the stack structures 115', the conducive layer 110' and filled in the slit trench 110T'. The method of forming the dielectric layer 116 may be as follows. First, a first dielectric layer 116a such as silicon oxide layer formed by high-density plasma chemical vapor deposition is formed on the stack structure 115' in the cell region CR, the staircase structure 115S and the conducive layer 110' in the staircase regions SR, and extends continuously to fill in the slit trench 110T' in the slit region R1. Next, a second dielectric layer 116b such as another silicon oxide layer formed by plasma-enhanced chemical vapor deposition (PECVD) is formed on the first dielectric layer 116a. In some embodiments, the gap fill ability of the first dielectric layer 116a is better than that of the second dielectric layer 116b, and the slit trench 110T' is filled with the first dielectric layer 116a, and the second dielectric layer 116b is not filled in the slit trench 110T'. In alternative embodiments, the first dielectric layer 116a, and the second dielectric layer 116b are both filled in the slit trench 110T' (not shown). Afterwards, planarization is performed by chemical-mechanical polishing so that top surfaces of the dielectric layer 116 in the cell region CR, the staircase regions SR and the slit region R1 are coplanar. The dielectric layer 116 filled in the slit trench 110T' (e.g., 110T1', 110T2', and 110T3') may be referred to as a slit SLT1 (e.g., SLT11, SLT12, and SLT13) as shown in FIG. 4A.

Figure 3D:
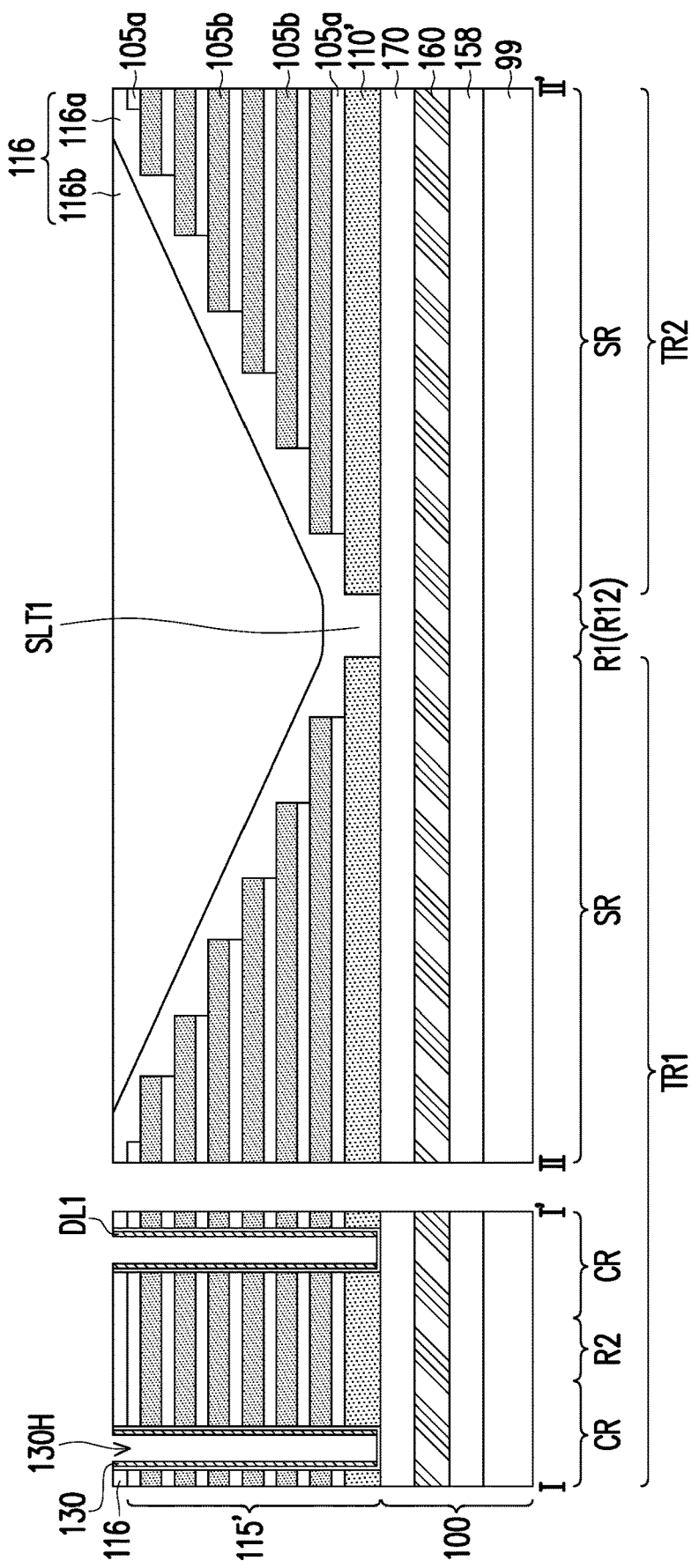

Next, referring to FIG. 2B and FIG. 3D, lithography and etching processes are performed to form openings 130H, 130T, and 130D in the stack structures 115'. In some embodiments, in the process of forming the openings 130H, 130T, and 130D, the conductive material layer 110' may serve as an etch stop layer, so that the depth of the openings 130H, 130T, and 130D may be well controlled. For example, to form the openings 130H, 130T, and 130D, the insulating material layer 105a and the sacrificial material layer 105b on the conductive layer 110' may be first removed by an etching process to form openings exposing the conductive layers 110'. Then, the conductive layer 110' exposed by the openings may be removed by another etching process to form the openings 130H, 130T, and 130D which expose the interlayer dielectric layer 170. In some embodiments, the radial dimensions of the openings 130T and 130D may be greater than the radial dimension of the opening 130H.

Then, vertical pillars are formed in the openings 130H, 130T, and 130D. First, a dielectric layer DL1 and a channel material layer (not shown) are sequentially formed on the sidewalls and bottoms of the openings 130H, 130T, and 130D. The dielectric layer DL1 may be continuous in its extending direction (e.g., in a direction perpendicular to the substrate 100). The dielectric layer DL1 may penetrate through the conductive layer 110' and be located in the substrate 100. The material of the dielectric layer DL1 may include silicon oxide. The dielectric layer DL1 may serve as an oxide layer or a bandgap engineered tunneling oxide layer adjacent to channel pillars 130 in an ONO composite layer. In other words, the dielectric layer DL1 may be a tunneling dielectric layer composed of a single-layer oxide layer or a tunneling dielectric layer composed of an ONO composite layer (e.g., a tunneling composite layer portion of a BE-SONOS). A charge storage layer (i.e., a nitride layer in the ONO composite layer) and a blocking layer (i.e., an oxide layer adjacent to the gate layer GL in the ONO composite layer) in the charge storage structure 150 (shown in FIG. 3I) may be located between the channel pillar 130 and the gate layer GL and between the gate layer GL and the insulating layer 105a.

Furthermore, the channel material layer located at the bottoms of the openings 130H, 130T, and 130D may be removed by an etch-back process to form channel pillars 130. The material of the channel pillar 130 may be a semiconductor material such as undoped polysilicon. The channel pillar 130 may penetrate through the stack structure 115' and the conductive layer 110' and extend into the substrate 100. In the top view, the channel pillar 130 has, for example, a ring shape and may be continuous in its extending direction (e.g., in a direction perpendicular to the substrate 100), as shown in FIG. 3D. In other words, the channel pillar 130 is integral in its extending direction and is not divided into multiple disconnected portions. In some embodiments, the channel pillar 130 may have a circular profile (as shown in FIG. 2B) in the top view, but the disclosure is not limited thereto. In other embodiments, the channel pillar 130 may also have a profile in another shape (e.g., polygonal) in the top view.

Figure 3E:
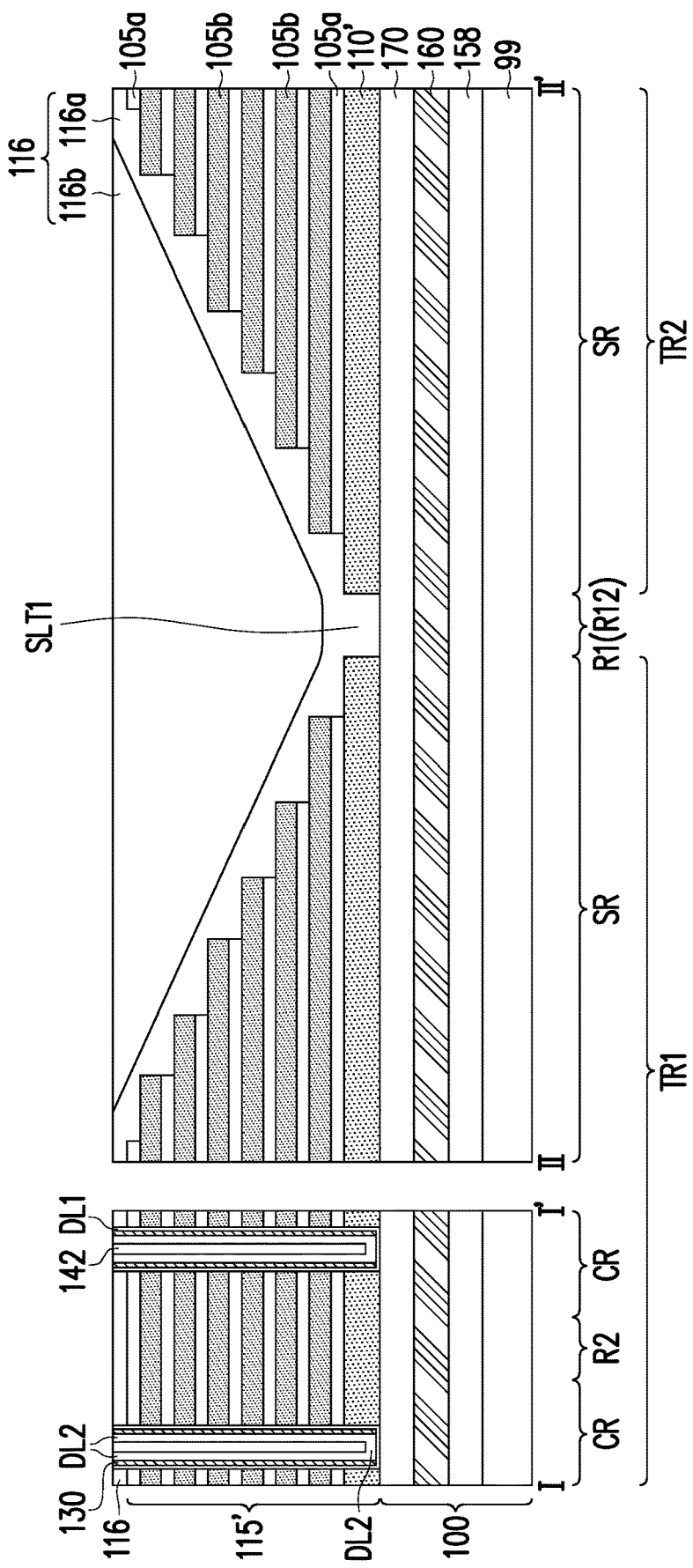

Then, referring to FIG. 2B and FIG. 3E, a dielectric layer DL2 is formed on the inner sidewall of the channel pillar 130 and on the dielectric layer DL1 exposed by the channel pillar 130. The dielectric layer DL2 may not fully fill the openings 130H, 130T, and 130D but leaves the central portions of the openings 130H, 130T, and 130D unfilled. Afterwards, an insulating material is filled in the central portions of the openings 130H, 130T, and 130D. In some embodiments, the radial dimension of the opening 130H is small, so its central portion is fully filled with the insulating material. The radial dimensions of the openings 130T and 130D are large, so their central portions are not fully filled with the insulating material but have space left therein. Next, an etch-back process is performed. The insulating material in the openings 130T and 130D is etched away by the etchant flowing into the space, while the insulating material remaining in the opening 130H forms an insulating pillar 142. The insulating pillar 142 and the dielectric layer DL2 have different materials, the material of the insulating pillar 142 is, for example, silicon nitride. Then, a dielectric layer DL3 is formed in the space in the openings 130T and 130D. The material of the dielectric layer DL3 is silicon oxide, for example. In some embodiments, the dielectric layer DL3 may be formed by a chemical vapor deposition method having a weaker gap filling capability, so that the opening 130T is not fully filled with the dielectric layer DL3, and a gap (not shown) is left in the middle of the dielectric layer DL3. As a result, the dummy pillars TVC and dummy pillars DVC are formed in the openings 130T and 130D, respectively.

Figure 3F:
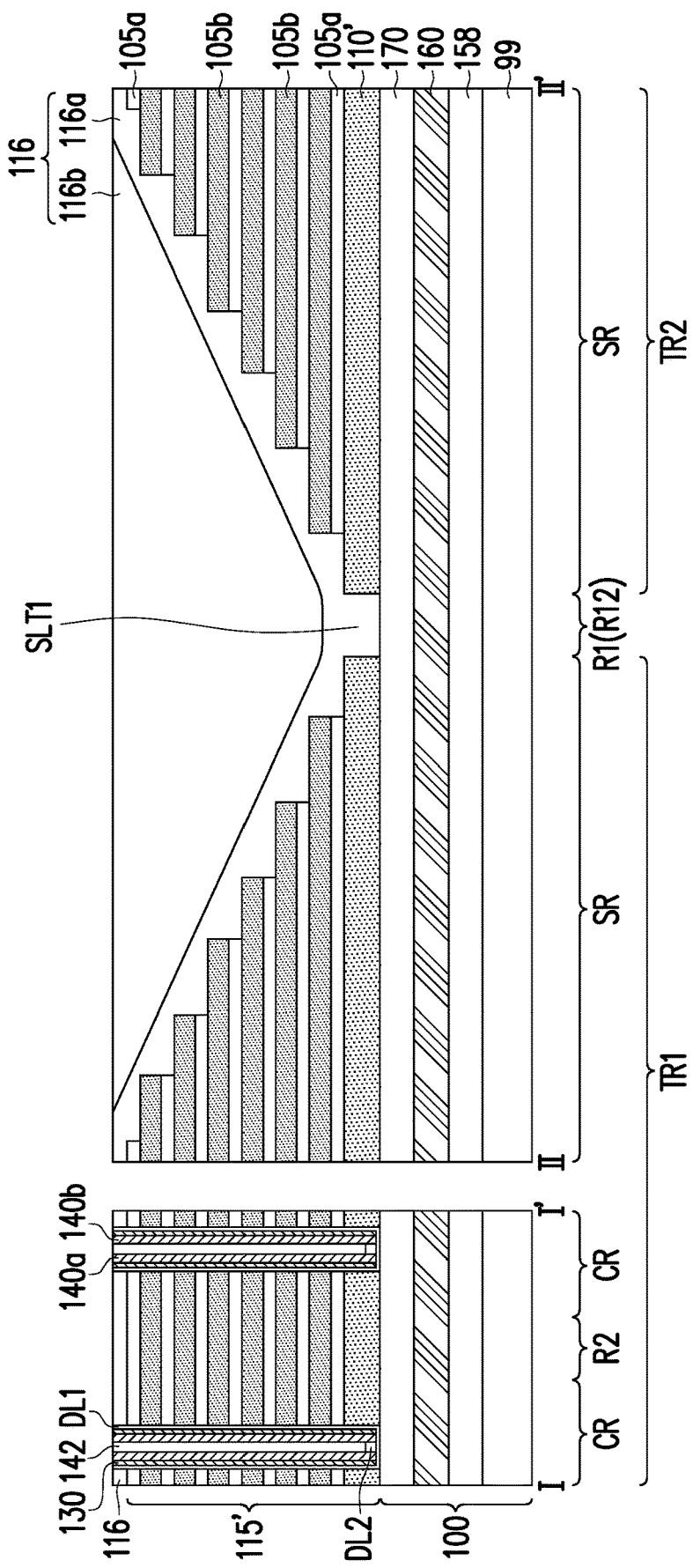
Figure 3G:
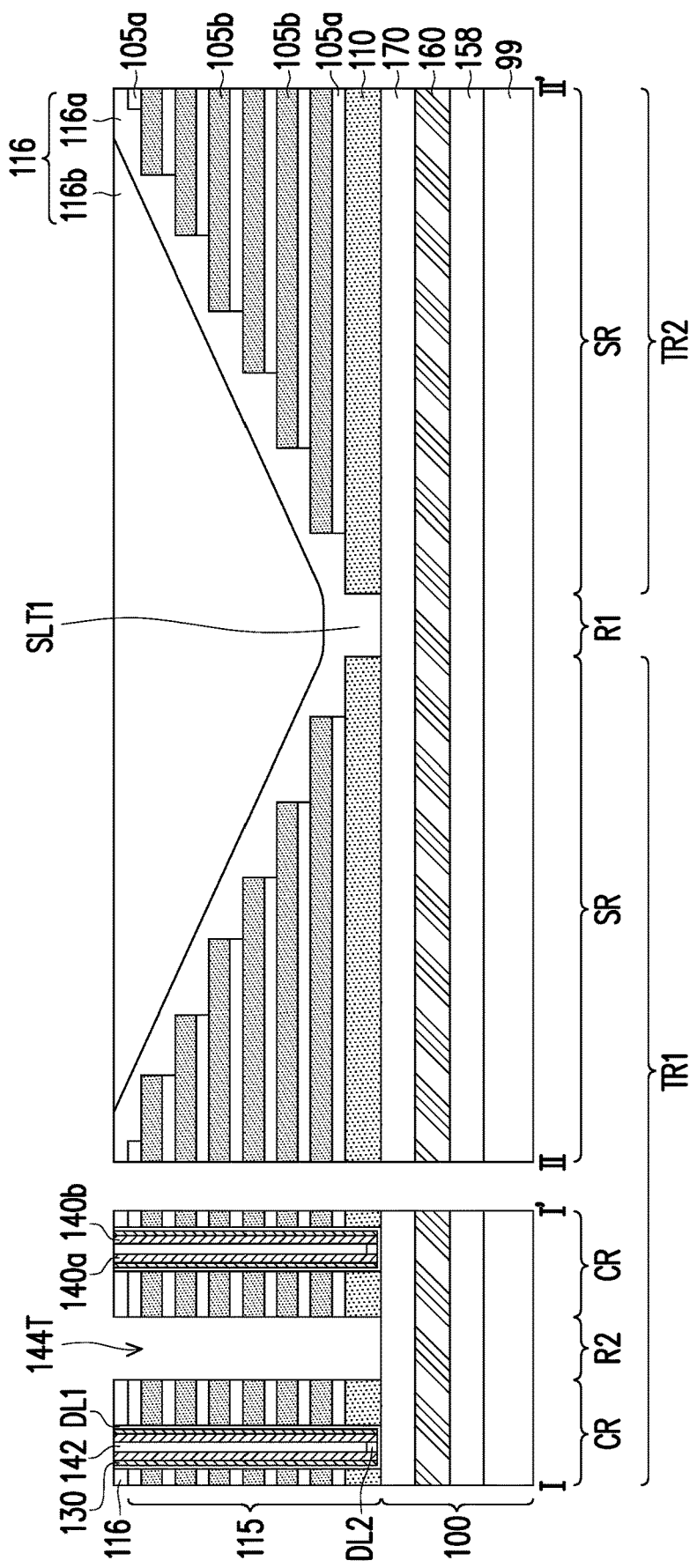

Referring to FIG. 2B and FIG. 3F, source and drain pillar openings are formed in the dielectric layer DL2 on two opposite sides of the insulating pillar 142 in the cell region CR, and a material such as doped polysilicon is filled in the source and drain pillar openings to form source and drain pillars 140a and 140b. Each channel pillar 130 may be electrically connected to a pair of source and drain pillars 140a and 140b. Then, referring to FIG. 2C, and FIG. 3G, a patterning process is performed on the stack structure 115' and the conductive layer 110' to form slit trench 144T penetrating through the stack structure 115' and the conductive layers 110'. In some embodiments, in the above patterning process, a portion of the dielectric layer 170 is also slightly removed, so that the trench 144T extends into the dielectric layer 170. In some embodiments, the above patterning process may include the following steps. First, a first patterning process is performed on the stack structure 115' by using the conductive layers 110' as an etch stop layer to form multiple patterned stack structures 115 on the conductive layers 110'.

Next, a second patterning process is performed on the conductive layer 110' to form multiple conductive layers 110. The etching masks used in the first patterning process and the second patterning process may be the same or different, and the disclosure is not limited thereto.

The slit trench 144T is formed in slit regions R2 (shown in FIG. 2C). The dielectric layer 116 in the slit regions R1 is retained when the slit trench 144T is formed in the slit regions R2. The slit trench 144T includes multiple slit trenches 144T1 to 144T5 in slit regions R21 to R25, corresponding to the slits SLT21 to SLT25 (shown in FIG. 1), each slit trenches 144T1 to 144T5 is a strip or a rectangular extending along the X direction, and may divide the stack structure 115' and the conductive layer 110' into multiple patterned stack structures 115 and multiple conductive layers 110 to define multiple tiles T1 to T4 in tile regions TR1 to TR4 and multiple blocks B1 to B4 in each tile and to isolate at least one of the conductive layers 110 from other conductive layers 110 (shown in FIG. 3G and FIG. 4B). The slit trenches 144T1 to 144T5 in the same tile (e.g., T1, T2, T3, or T4) are separated from each other, and the adjacent ends of the slit trenches (e.g., T1, T2, T3, or T4) in adjacent tiles (e.g., T1 and T2, or T3 and T4) are separated from each other by the dielectric layer 116. For brevity and clarity, the slit trenches 144T1 to 144T5, the dielectric layer 116 and the substrate 100 are shown in FIG. 4B, and other components are omitted.

Figure 3H:
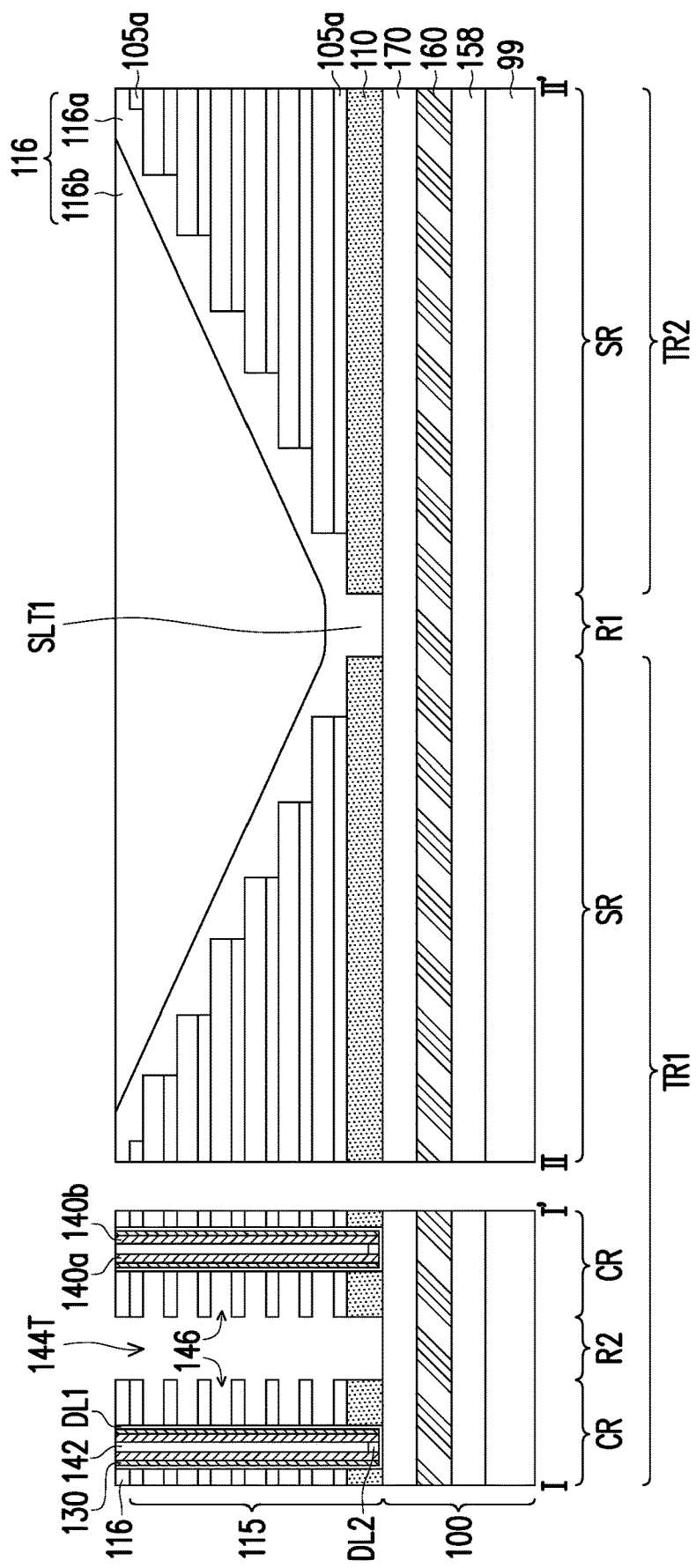

Then, referring to FIG. 2C and FIG. 3H, the sacrificial layers 105b in the patterned stack structure 115 are removed to form horizontal openings 146 between two adjacent insulating layers 105a. In some embodiments, the trench 144T may communicate with the horizontal openings 146. In some embodiments, the sacrificial layers 105b may be removed by using a hot phosphoric acid flowing into the slit trenches 144T1-144T5. The area of the sacrificial layer 105b removed by the hot phosphoric acid is limited; namely, the sacrificial layer 105b adjacent to the trench 144T is removed, and the sacrificial layer 105b far away from the trench 144 is retained to form a part of the dummy gate stack structure DGS (shown in FIG. 1).

During removal of the sacrificial layers 105b, the channel pillar 130, the dielectric layers DL1 and DL2, the source and drain pillars 140a and 140b, and the insulating pillar 142 in the cell region CR, and the channel pillar 130 and the dielectric layers DL1, DL2, and DL3 in the staircase region SR may serve as supporting pillars to maintain the stability of the structure. Further, in the process of removing the sacrificial layers 105b, parts of the dielectric layer 116 in the tile region TR1 and the second tile region TR2, and parts of the dielectric layer 116 in the tile region TR3 and the second tile region TR4 (shown in FIG. 1) are connected each other through part of the dielectric layer 116 in the slit regions R1, and thus the parts of the dielectric layer 116 in the slit regions R1 may serve as supporting walls 116SW to maintain the stability of the patterned stack structure 115 (as shown in FIG. 4A and FIG. 4B).

Figure 3I:
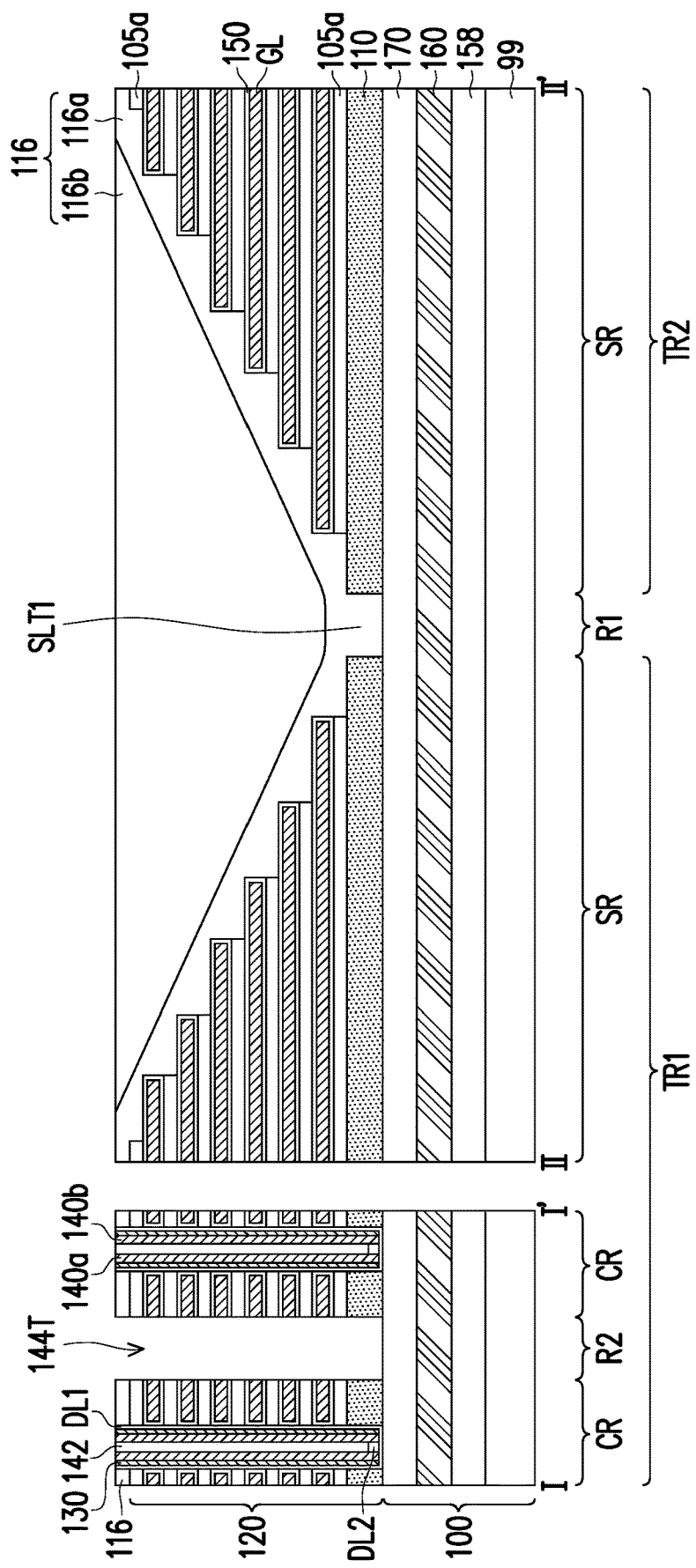

Afterwards, referring to FIG. 2D and FIG. 3I, charge storage structures 150 and gate layers GL are sequentially formed in the horizontal openings 146 to form gate stack structures 120. The gate stack structure 120 includes staircase structures 120S located in the staircase regions SR. The charge storage structure 150 may be disposed between the gate layer GL and the corresponding channel pillar 130. In some embodiments, the charge storage structure 150 may be an oxide-nitride-oxide (ONO) composite layer. In the case where the dielectric layer DL1 may serve as an oxide layer (tunneling oxide layer) adjacent to the channel in the ONO composite layer, a nitride layer (charge storage layer) and an oxide layer (blocking layer) adjacent to the gate layer GL may be sequentially formed in the horizontal opening 146 to form the charge storage structure 150 between the channel pillar 130 and the gate layer GL. In this embodiment, the nitride layer (charge storage layer) and the oxide layer (blocking layer) adjacent to the gate layer GL in the ONO composite layer may be located between the gate layer GL and the insulating layer 105a. The material of the gate layer GL may include tungsten (W), cobalt (Co), aluminum (Al), tungsten silicide (WSi$_x$), or cobalt silicide (CoSi$_x$). In some embodiments, the charge storage structure 150 and the gate layer GL may be formed by the following steps. First, a charge storage material layer (not shown) is conformally formed on the surfaces of the horizontal opening 146 and the slit trench 144T. The charge storage material layer does not fully fill the horizontal opening 146, but leaves the central portion of the horizontal opening 146 unfilled. Next, a gate material layer (not shown) is formed on the charge storage material layer. The gate material layer is filled in the central portion of the horizontal openings 146 and formed on the surface of the slit trench 144T. Then, the charge storage material layer and the gate material layer in the trench 144T are removed by a process such as an anisotropic etch-back process to form the charge storage structures 150 and the gate layers GL in the horizontal openings 146.

In some embodiments, a buffer layer and a barrier layer may be disposed between the gate layer GL and the charge storage structure 150. The material of the buffer layer is, for example, a high dielectric constant material having a dielectric constant greater than 7, such as aluminum oxide ($Al_2O_3$), hafnium oxide ($HfO_2$), lanthanum oxide ($La_2O_5$), a transition metal oxide, a lanthanide oxide, or a combination thereof. The material of the barrier layer is, for example, titanium (Ti), titanium nitride (TiN), tantalum (Ta), tantalum nitride (TaN), or a combination thereof.

Figure 3J:
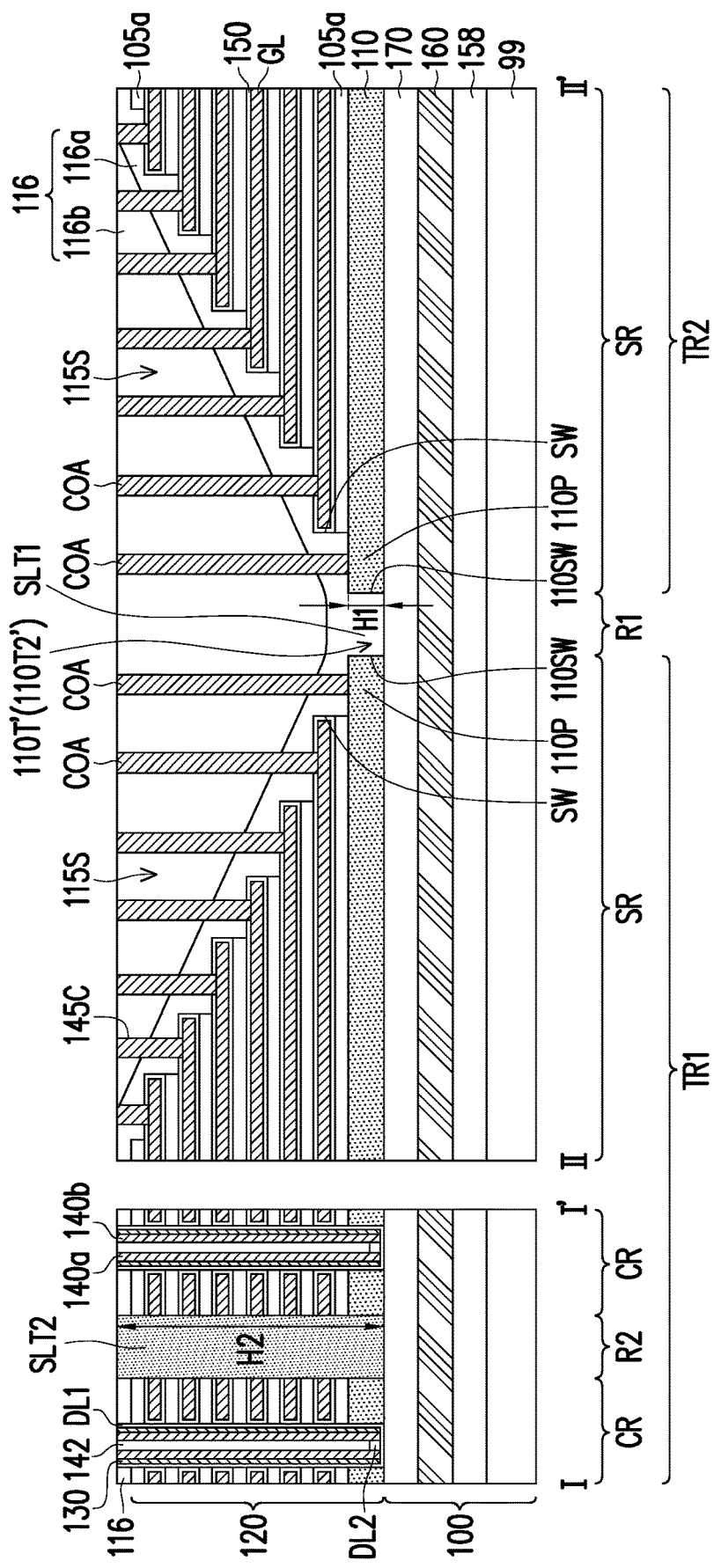

Next, referring to FIG. 2D, FIGS. 3J and 4B, the trench 144T is filled with a dielectric layer to form a slit SLT2. The slit SLT2 includes slits SLT21, SLT22, SLT23, SLT24, and SLT25 may fully fill the slit trenches 144T1, 144T2, 144T3, 144T4, and 144T5, respectively. In other words, the slit SLT2 may be located between two adjacent gate stack structures 120 and/or between the gate stack structure 120 and the dummy gate stack structure DGS as shown in FIG. 1. The dielectric layer for the SLT2 may be silicon oxide, silicon nitride, or a combination thereof, and the dielectric layer for the SLT2 and the dielectric layer 116a may be materials formed by different methods.

The second slit SLT2 has a height H2 different from a height H1 of the first slit SLT1. The height H2 of the second slit SLT2 is greater than the height H1 of the first slit SLT1. In some embodiments, a top surface of the dielectric layer 116b over the first slit SLT1 is coplanar with a top surface of the second slit SLT2, as shown in FIG. 3J.

The slit SLT2 and the dielectric layer 116 over the slit trench 110T' have interfaces 144I therebetween, as shown in FIG. 4B. The dielectric layer 116 continuously extends from the tile region TR1 to the tile region TR2 along the X direction, and there is no interface extending from a top surface of the dielectric layer 116 to a top surface of the interlayer dielectric layer 170 in the dielectric layer 116 extending from the tile region TR1 to the tile region TR2 along the X direction, as shown in FIG. 3J.

Then, a patterning process is performed to define the sizes and positions of through-array vias TAV and contacts COA. Parts of the dielectric layer in the dummy pillars TVC are removed to form multiple openings 145T for the through-array vias TAV which extends to the conductive line 160, and multiple openings 145C for the contacts COA which extends to the gate layers GL and the conductive layers 110.

Figure 5B:
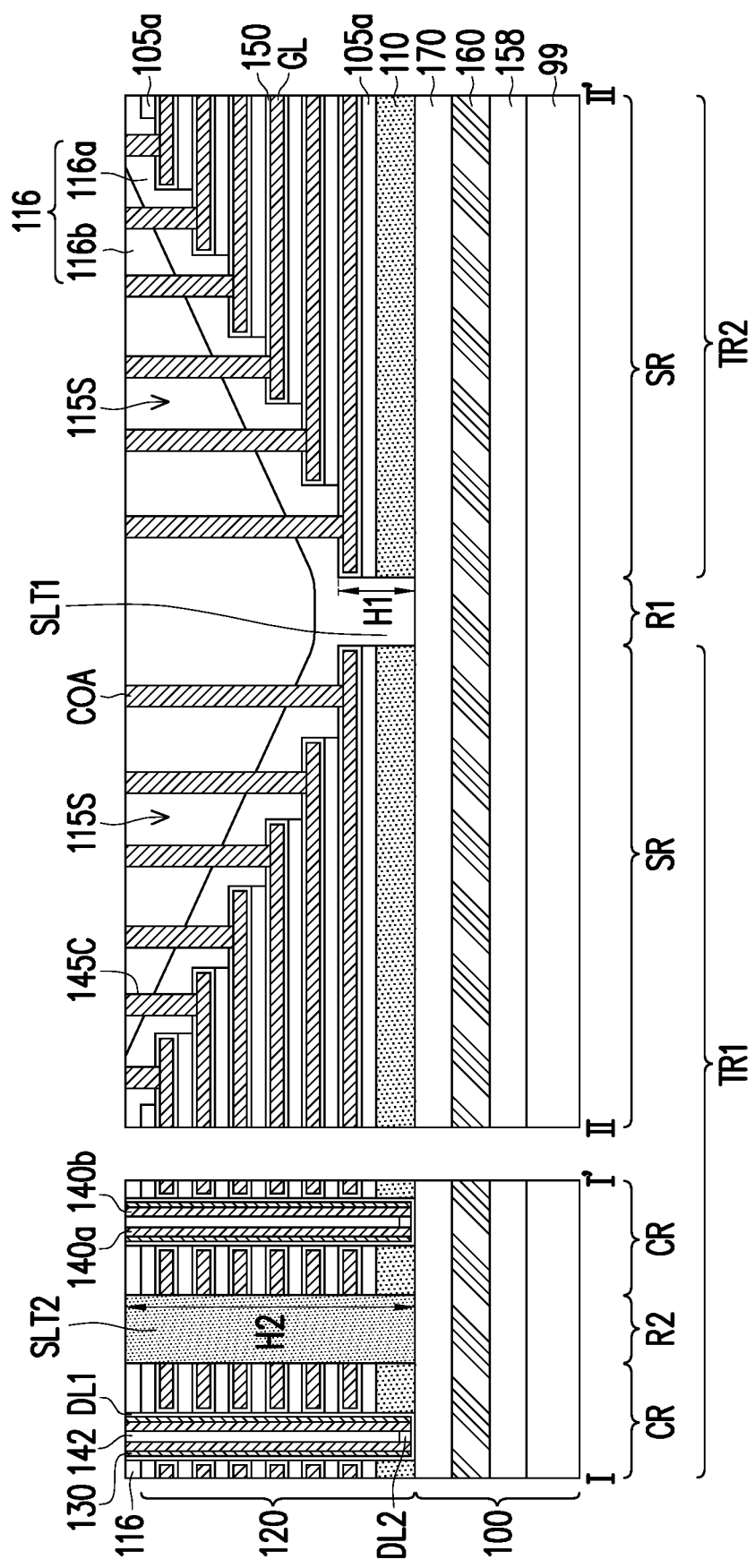
Figure 6B:
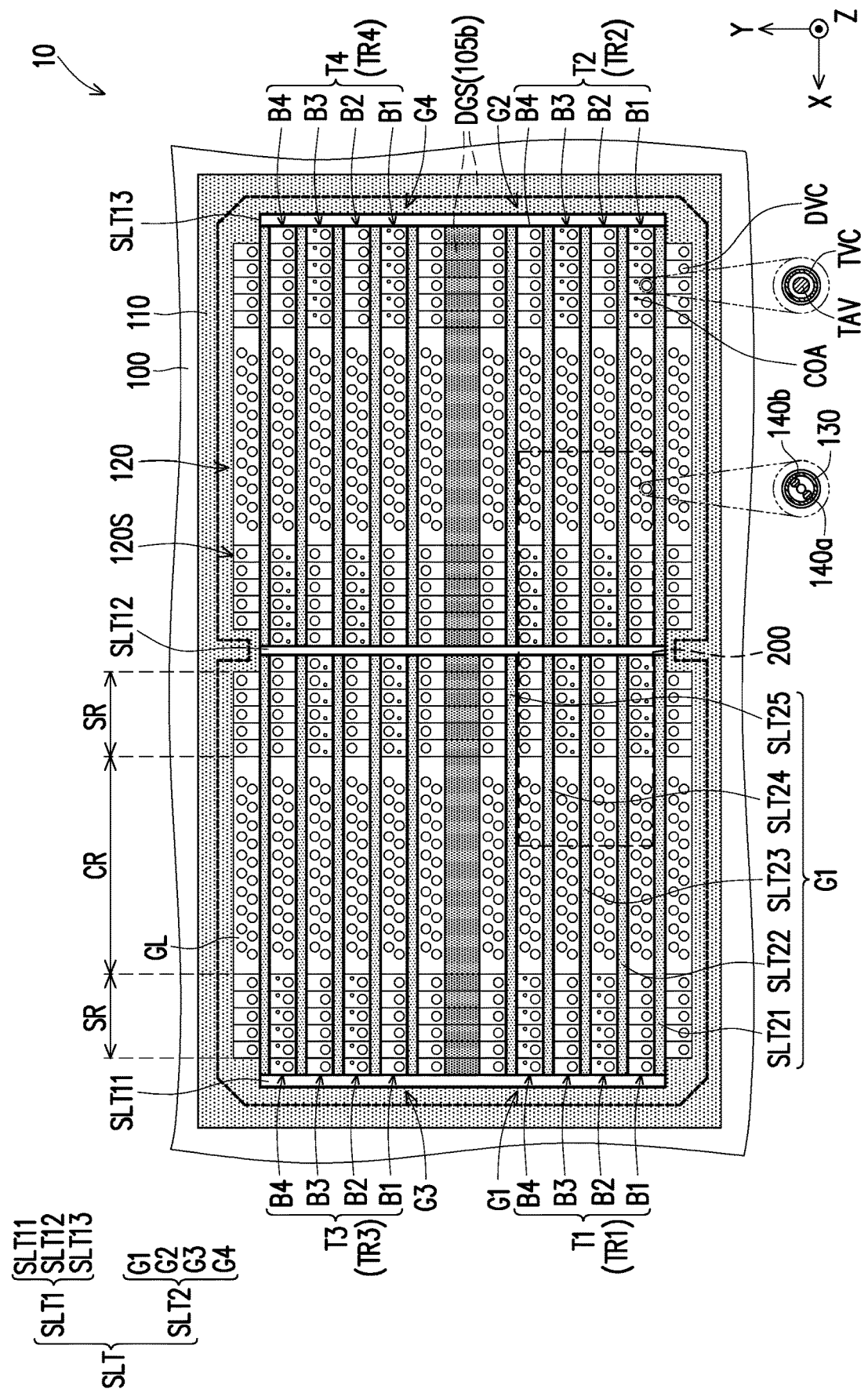
FIG. 6B is a top view of the memory device of FIG. 5B.

Next, through-array vias TAV and contacts COA are formed in the openings 145T and 145C, respectively, as shown in FIG. 2D. The through-array via TAV penetrates through the gate stack structure 120 and the conductive layer 110 and extends into the substrate 100. The through-array via TAV is connected to the conductive line 160 in the substrate 100. In some embodiments, the contacts COA are electrically connected to and land on the gate layer GL of each stair. In some embodiments, the contacts COA also landed on the protrude portions 110P of the conductive layer 110, as shown in FIG. 1, FIG. 2D and FIG. 3J. The protrude portions 110P of the conductive layer 110 are located between the sidewall 110SW of the slit trench 110T' and the sidewall SW of the bottommost stair of the staircase structure 115S, as shown in FIG. 3J. In alternative embodiments, when the sidewalls 110SW' of the conductive layer 110 exposed by the slit trenches 110T' aligned with the sidewalls SW of the bottommost stairs BS1 of the staircase structures 115S, the contacts COA are not landed on the conductive layer 110 as show in FIG. 5A, FIG. 5B and FIG. 6B.

In summary of the above, in the embodiments of the disclosure, the first slit between the adjacent tiles are formed before the second silt trench for the second slit between the adjacent blocks is formed, and thus the first slit may be used as a support structure during the replacement process for the gate layers to avoid bending or even collapse of the gate stack structures.

What is claimed is:

1. A method of fabricating a memory device, comprising:
   providing a substrate, wherein the substrate comprises a first tile region and a second tile region;
   forming a conductive layer over the substrate;
   forming a stacked structure on the conductive layer, wherein stacked structure comprises multiple insulating layers and multiple sacrificial layers which alternate with each other;
   patterning the stacked structure to form a first staircase structure in the first tile region and a second staircase structure in the second tile region;
   patterning the conductive layer to form a first slit trench along a first direction in the conductive layer and between the first tile region and the second tile region;
   forming a first dielectric layer overlaying the first staircase structure and the second staircase structure and filling into the first slit trench, wherein the first dielectric layer filled in the first slit trench forms a first slit along the first direction;
   patterning the first dielectric layer, the stacked structure, and the conductive layer to form multiple second slit trenches in the first tile region and the second tile region respectively, wherein the second slit trenches along a second direction perpendicular to the first direction;
   performing a replacement process to replace the sacrificial layers with multiple gate conductive layers; and
   filling a second dielectric layer in the second slit trenches to form multiple second slits.

2. The method of claim 1, further comprising:
   forming a vertical pillar extending in the stacked structure, wherein the forming the vertical pillar comprises:
      forming an opening extending in the stacked structure and the conductive layer;
      forming a third dielectric layer extending in the stacked structure on a sidewall of the opening;
      forming a channel pillar extending in the stacked structure on a sidewall of third dielectric layer; and
      forming a source pillar and a drain pillar extending in the stacked structure, wherein the source pillar and the drain pillar are encircled by and electrically connected to the channel pillar, respectively.

3. The method of claim 2, wherein the first slit is formed before forming the vertical pillar, and the second slit trenches are formed after forming the vertical pillar.

4. The method of claim 1, wherein the performing the replacement process comprises:
   removing the sacrificial layers to form multiple horizontal openings;
   forming multiple charge storage structures in the horizontal openings; and
   forming the gate conductive layers on the charge storage structures in the horizontal openings.

5. The method of claim 1, wherein the first slit is formed before the second slit trenches are formed.

6. The method of claim 1, wherein the second slits and the first slit have materials formed by different method.

7. The method of claim 1, wherein, in the first direction, a first sidewall of the first slit trench is formed to be aligned with a first sidewall of a bottommost stair of the first staircase structure, and a second sidewall of the first slit trench is formed to be aligned with a second sidewall of a bottommost stair of the second staircase structure.

8. The method of claim 1, wherein, in the second direction, a first sidewall of the first slit trench is formed to protrude from a first sidewall of a bottommost stair of the first staircase structure, and a second sidewall of the first slit trench is formed to protrude from a second sidewall of a bottommost stair of the second staircase structure.

9. The method of claim 1, wherein the first dielectric layer between the first tile region and the second tile region is not removed when the second slit trenches are formed.

10. The method of claim 1, wherein forming the first dielectric layer comprises:
    forming a first dielectric material layer overlaying the first staircase structure and the second staircase structure, and filling into the first slit trench, wherein the first dielectric material layer filled into the first slit trench forms the first slit;
    forming a second material dielectric layer overlaying the first dielectric material layer; and
    planarizing the second dielectric material layer.

11. A memory device, comprising:
    a substrate comprising a first region and a second region;
    a conductive layer over the substrate in the first region and the second region, wherein the conductive layer has a first slit trench along a first direction in a region between the first region and the second region;
    a stacked structure on the conductive layer, wherein the stacked structure comprises a first staircase structure in the first region and a second staircase structure in the second region;
    a dielectric layer overlaying the first staircase structure and the second staircase structure, and filling into the first slit trench, wherein the dielectric layer filled in the first slit trench forms a first slit along the first direction; and
    multiple second slits along a second direction perpendicular to the first direction extending from a top surface of the dielectric layer through the stacked structure to a bottom surface of the conductive layer in the first region and the second region.

12. The memory device of claim 11, further comprising:
    a vertical pillar extending in the stacked structure, wherein the vertical pillar comprises:
    a channel pillar extending in the stacked structure;
    a source pillar and a drain pillar extending in the stacked structure, wherein the source pillar and the drain pillar are electrically connected to the channel pillar, respectively; and
    multiple charge storage structures between the channel pillar and gate conductive layers, wherein the gate conductive layers are formed in the stacked structure.

13. The memory device of claim 11, wherein a height of the first slit is lower than a height of the second slits.

14. The memory device of claim 11, wherein the second slits and the dielectric layer over the first slit trench have interfaces therebetween.

15. The memory device of claim 11, wherein the dielectric layer continuously extends from the first region to the second region, and there is no interface extending from a top surface of the dielectric layer to a bottom surface of the conductive layer in the dielectric layer extending from the first region to the second region.

16. The memory device of claim 11, wherein the dielectric layer comprises:
   a first material layer disposed over the substrate, wherein the first material layer is disposed over the first staircase structure and the second staircase structure, and continuously extending into the first slit trench; and
   a second material layer disposed over the first material layer.

17. The memory device of claim 11, wherein, in the first direction, a first sidewall of the first slit is aligned with a first sidewall of a bottommost stair of the first staircase structure, and a second sidewall of the first slit trench is aligned with a second sidewall of a bottommost stair of the second staircase structure.

18. The memory device of claim 11, wherein, in the second direction, a first sidewall of the first slit trench protrudes from a first sidewall of a bottommost stair of the first staircase structure, and a second sidewall of the first slit trench protrudes from a second sidewall of a bottommost stair of the second staircase structure.

19. The memory device of claim 18, comprising:
   at least one contact landing on a protrude portion of the conductive layer, wherein the protrude portion of the conductive layer is located between the first sidewall of the first slit trench and the first sidewall of the bottommost stair of the first staircase structure, or between the second sidewall of the first slit trench and the second sidewall of the bottommost stair of the second staircase structure.

20. The memory device of claim 11, wherein the dielectric layer comprises:
   a first material layer disposed over the substrate, wherein the first material layer is disposed over the first staircase structure and the second staircase structure, and continuously extending into the first slit trench; and
   a second material layer disposed over the first material layer.

* * * * *